(12) United States Patent
Nakatani et al.

(10) Patent No.: US 9,076,714 B2
(45) Date of Patent: Jul. 7, 2015

(54) SUBSTRATE FOR MOUNTING LIGHT-EMITTING ELEMENT AND LIGHT-EMITTING DEVICE

(75) Inventors: Seiichi Nakatani, Osaka (JP); Tatsuo Ogawa, Osaka (JP); Kazuo Kimura, Osaka (JP); Shigetoshi Segawa, Ehime (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 244 days.

(21) Appl. No.: 13/581,695

(22) PCT Filed: Feb. 23, 2011

(86) PCT No.: PCT/JP2011/001017
§ 371 (c)(1),
(2), (4) Date: Aug. 29, 2012

(87) PCT Pub. No.: WO2011/108227
PCT Pub. Date: Sep. 9, 2011

(65) Prior Publication Data
US 2012/0319159 A1 Dec. 20, 2012

(30) Foreign Application Priority Data
Mar. 1, 2010 (JP) ................................ 2010-043773

(51) Int. Cl.
*H01L 29/86* (2006.01)
*H01L 25/16* (2006.01)
(Continued)

(52) U.S. Cl.
CPC ............ *H01L 25/167* (2013.01); *H01L 33/486* (2013.01); *H01L 33/54* (2013.01);
(Continued)

(58) Field of Classification Search
CPC ...... H01L 25/167; H01L 33/486; H01L 33/54; H01L 33/641; H01L 2924/0002; H01L 2933/0033; H01L 2924/00
USPC ................... 257/99, 536, E21.004, E29.325, 257/E33.002
See application file for complete search history.

(56) References Cited

U.S. PATENT DOCUMENTS

2005/0184387 A1* 8/2005 Collins et al. ................ 257/712
2007/0200133 A1 8/2007 Hashimoto et al.
(Continued)

FOREIGN PATENT DOCUMENTS

JP 2005-244220 9/2005
JP 2006-339559 12/2006
(Continued)

OTHER PUBLICATIONS

International Preliminary Report on Patentability issued Sep. 20, 2012 in International (PCT) Application No. PCT/JP2011/001017, together with English translation.
(Continued)

*Primary Examiner* — Selim Ahmed
(74) *Attorney, Agent, or Firm* — Wenderoth, Lind & Ponack, L.L.P.

(57) ABSTRACT

There is provided a substrate for light-emitting element, including a mounting surface on which a light-emitting element is to be mounted, the mounting surface being one of two opposed main surfaces of the substrate. The substrate of the present invention is provided with a protection element for the light-emitting element, the protection element comprising a voltage-dependent resistive layer embedded in a body of the substrate, and comprising a first electrode and a second electrode each of which is in connection with the voltage-dependent resistive layer wherein the light-emitting element is to be mounted such that it is positioned in an overlapping relation with the voltage-dependent resistive layer.

8 Claims, 22 Drawing Sheets

(51) Int. Cl.
- *H01L 33/48* (2010.01)
- *H01L 33/54* (2010.01)
- *H01L 33/64* (2010.01)

(52) U.S. Cl.
CPC .... *H01L 33/641* (2013.01); *H01L 2924/09701* (2013.01); *H01L 2933/0033* (2013.01); *H01L 2924/0002* (2013.01)
USPC .................................. 257/536; 257/E21.004

(56) References Cited

U.S. PATENT DOCUMENTS

2007/0297108 A1* 12/2007 Collins et al. ................... 361/56
2009/0027157 A1   1/2009 Katsumura et al.
2009/0189732 A1   7/2009 Sato et al.

FOREIGN PATENT DOCUMENTS

| JP | 2008-28029 | 2/2008 |
| JP | 2009-129928 | 6/2009 |
| JP | 2009-252930 | 10/2009 |
| WO | 2006/035626 | 4/2006 |
| WO | 2006/106717 | 10/2006 |

OTHER PUBLICATIONS

International Search Report issued May 31, 2011 in International (PCT) Application No. PCT/JP2011/001017.

Office Action and Search Report issued Dec. 12, 2014 in Chinese Patent Application No. 201180005655.2 (with English translation of search report).

* cited by examiner

Fig. 1
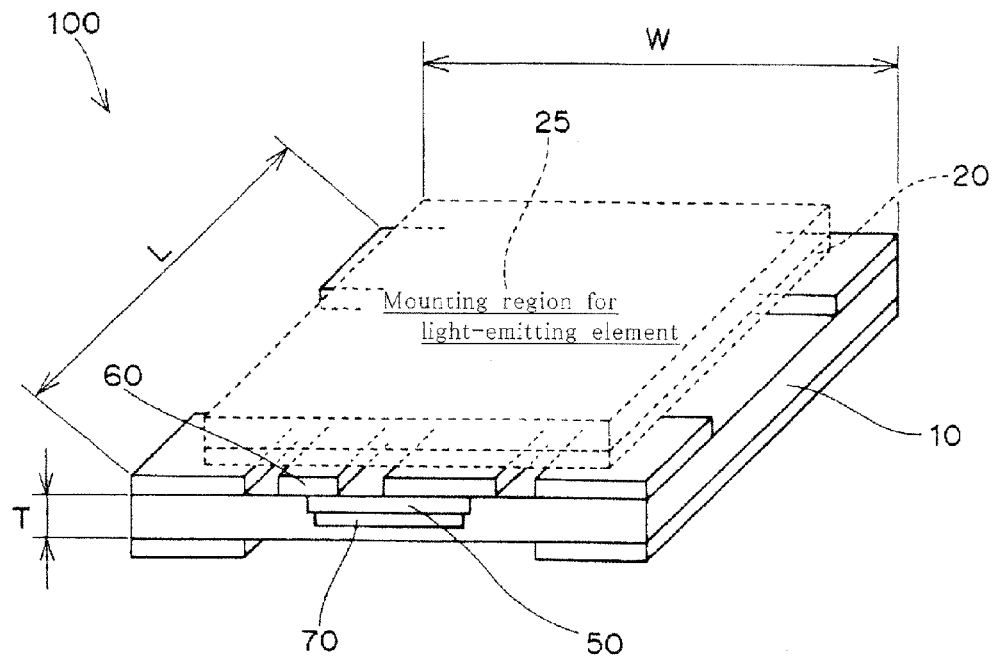
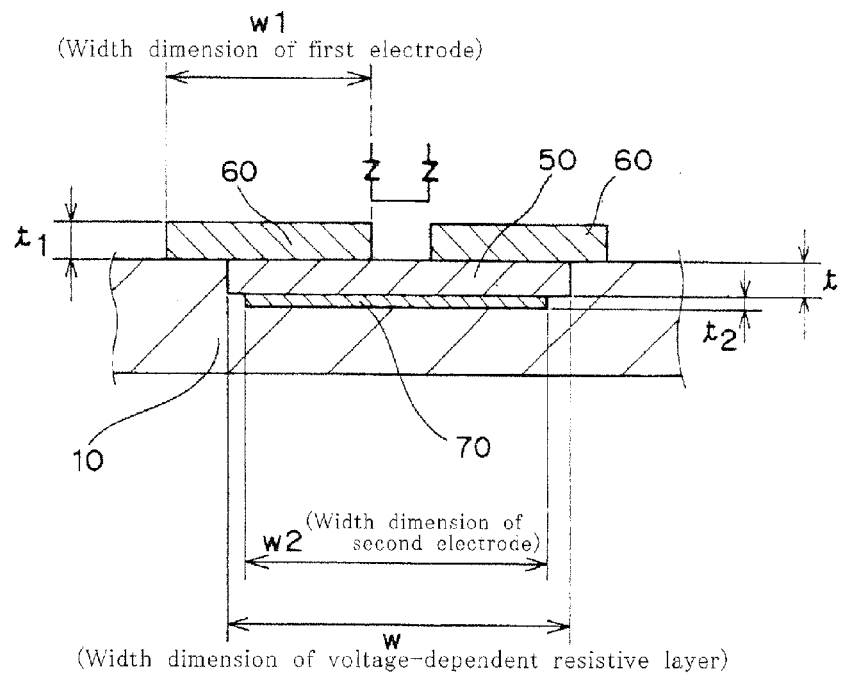

Fig. 7
(a)
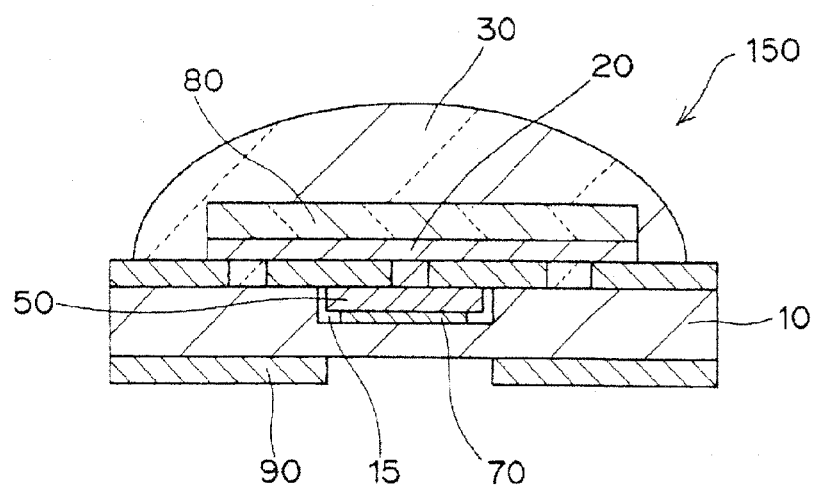
(b)
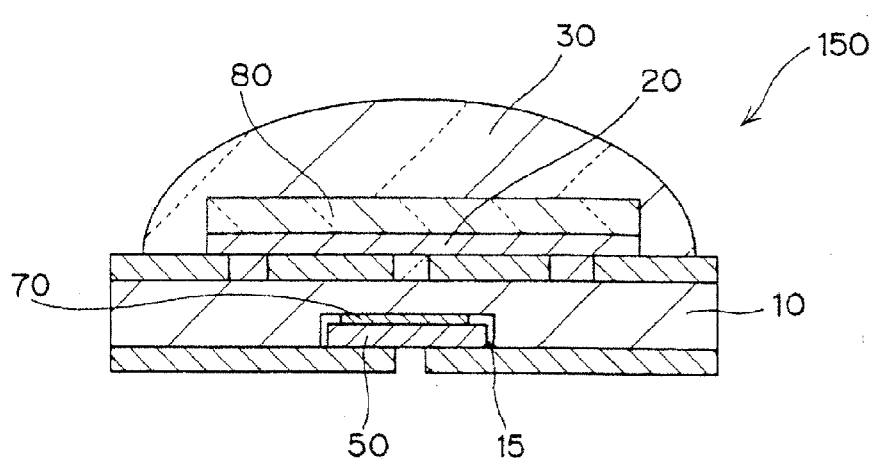
(c)
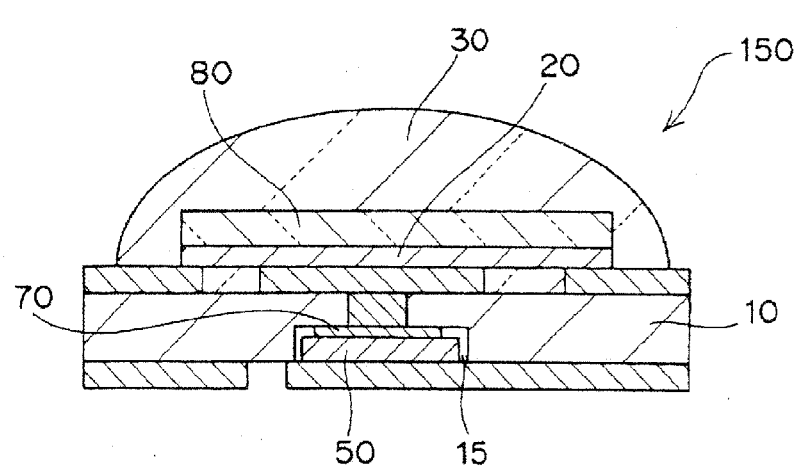

Fig. 8
(a)
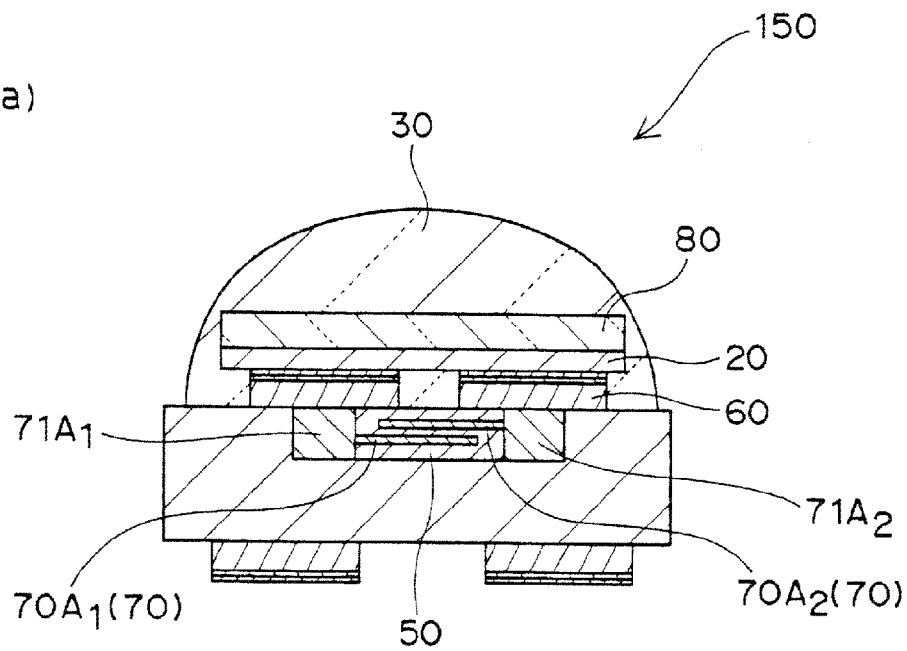
(b)
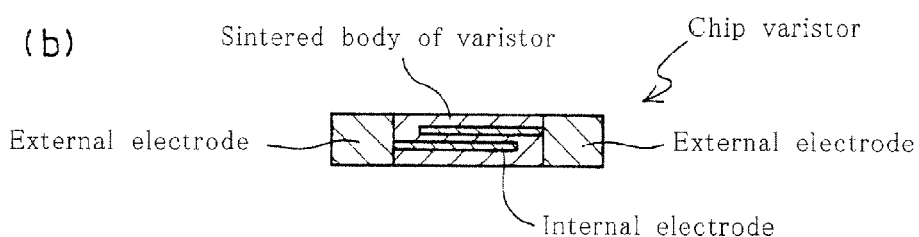
(c)
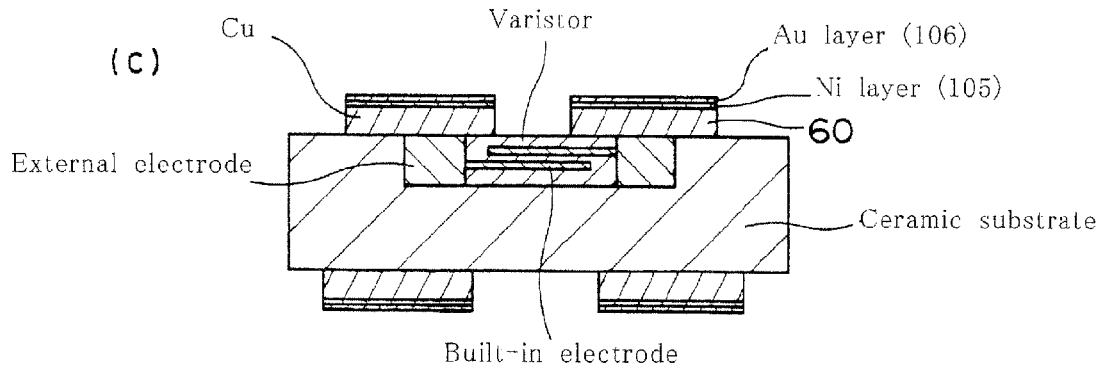

Fig. 10
(a)
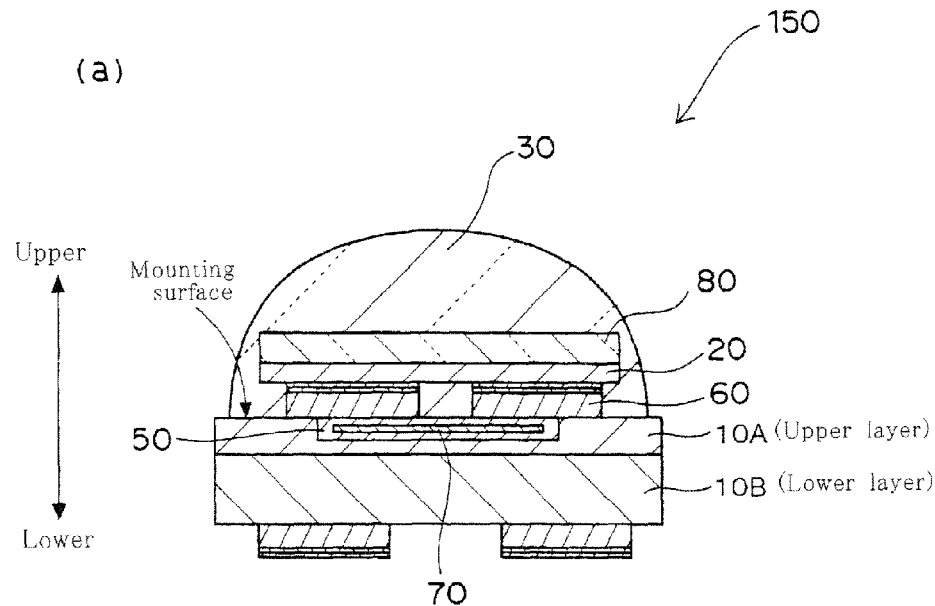
(b)
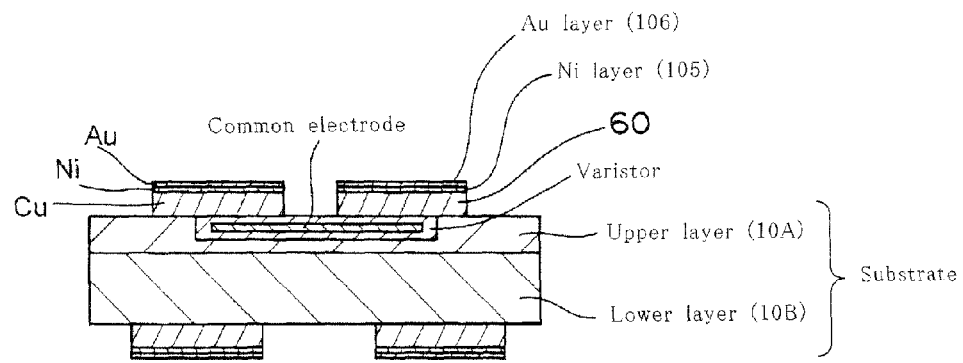

Fig. 12
(a) 
(b) 
(c) 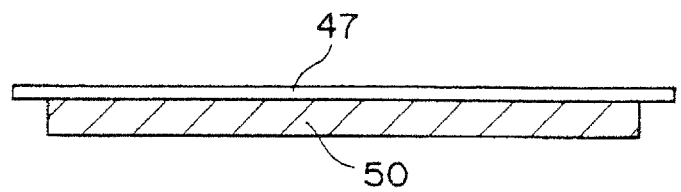
(d) 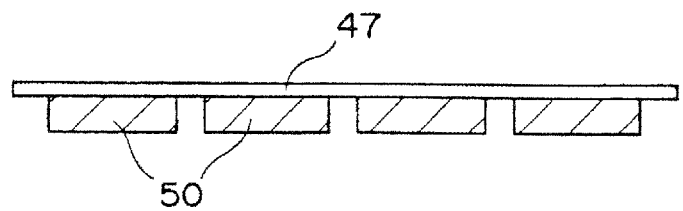

Fig. 18
(a)
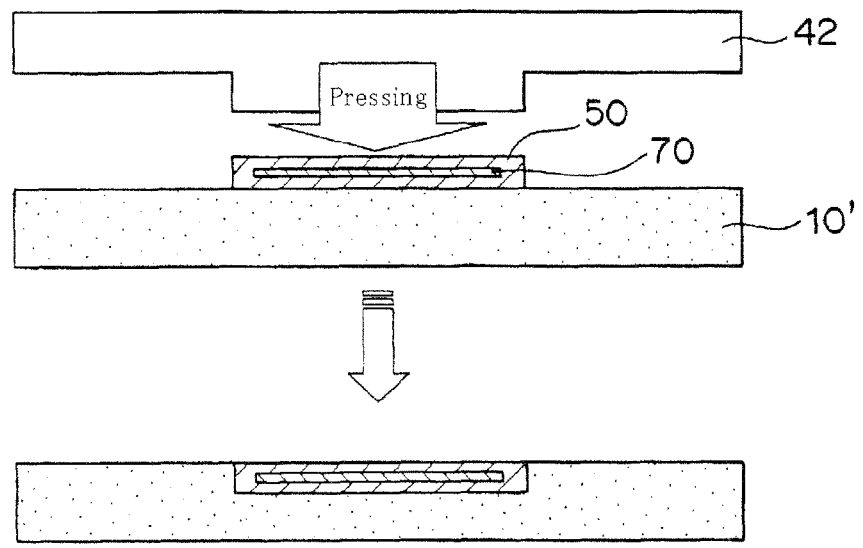
(b)
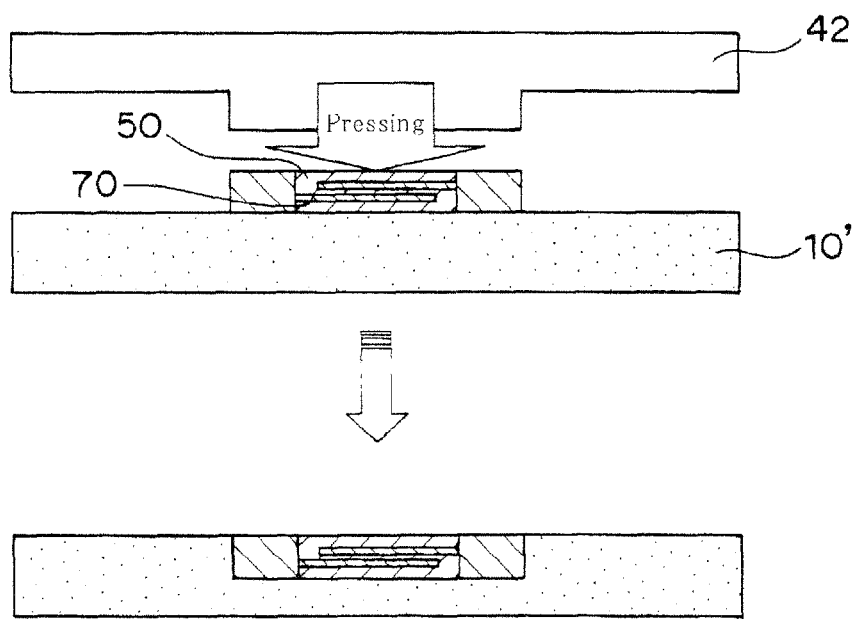

*Fig. 19*
Semi-Additive Process
No shrinkage process (LTCC) & Skip of via formation
(a) Sintered body of LTCC (after embedding of varistor)
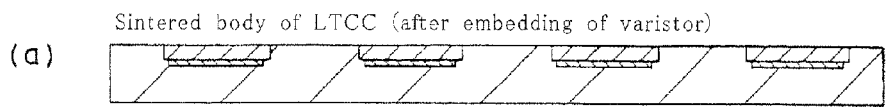
(b) Formation of catalyst + Electroless Ni(Cu) plating
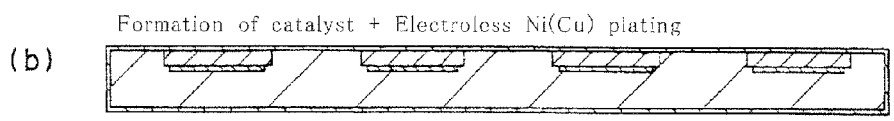
(c) Formation of resist (photolithography)
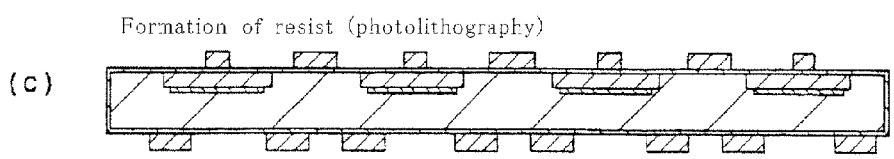
(d) Electrolytic Cu plating
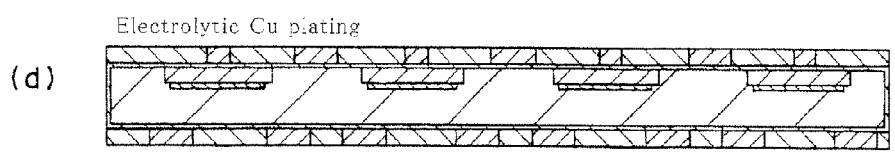
(e) Removing of resist
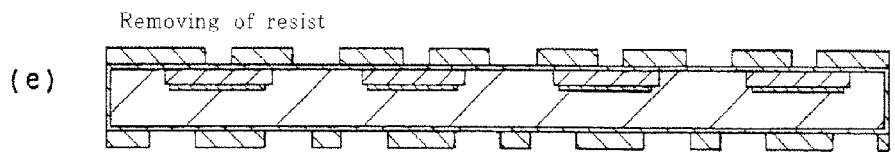
(f) Soft Cu etching (which leads to completion of substrate manufacturing)
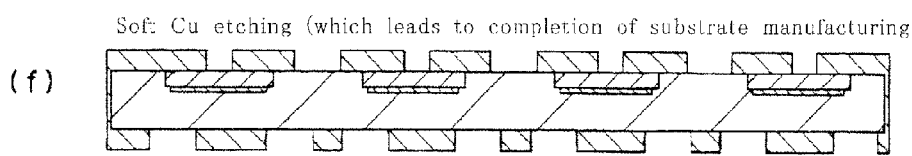
Cu : Thickness 75 μm
: Gap 60 μm Fig. 23
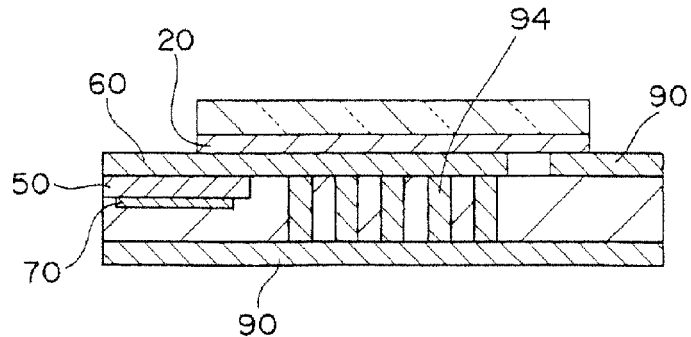
Fig. 24
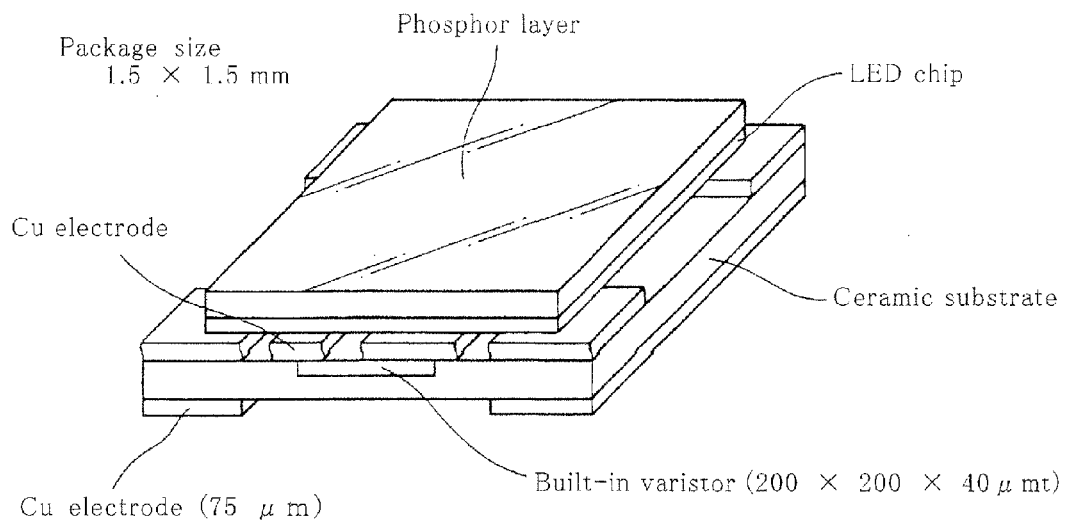
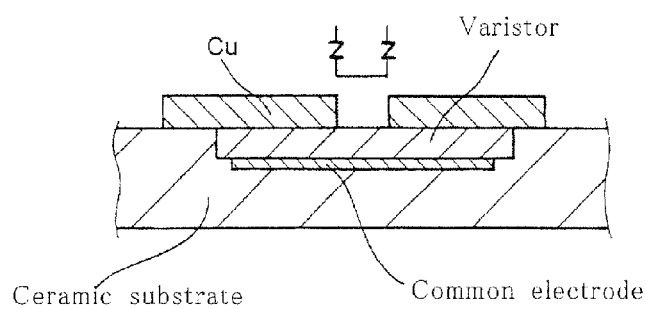

SUBSTRATE FOR MOUNTING LIGHT-EMITTING ELEMENT AND LIGHT-EMITTING DEVICE

TECHNICAL FIELD

The present invention relates to a substrate for a light-emitting element and a manufacturing method thereof. More particularly, the present invention relates to a light-emitting element substrate on which a light-emitting diode (hereinafter also referred to as "LED") is to be mounted, and a method for manufacturing such substrate. The present invention also relates to a light-emitting device wherein a light-emitting element is mounted on the substrate for light-emitting element.

BACKGROUND OF THE INVENTION

Recently, LEDs serving as a light source are used for various purposes in terms of their longer life and energy savings. Especially during recent years, luminous efficiency of the LEDs for high-light use is improving and thus the LEDs are used for a lighting purpose.

In a case of a white LED used for the lighting purpose, the light quantity can be increased by applying a larger current to the LED. However, a performance of the LED can be degraded under such a severe condition that a large current is applied. Therefore, there is concern that the LED package and a LED module cannot have a longer life and a high reliability. For example, when an electric current flowing through the LED is increased, the heat attributed to the LED increases. Accordingly, the temperature tends to rise in the LED module for lighting and a system thereof, which can cause a deterioration of the LED module and the system. In this regard, only about 25% of the electric power to be consumed in the white LED is converted into the visible light and the rest of the electric power is directly converted into the heat. Therefore, it is required to release the heat from the LED package and the LED module. For example, various types of heat sinks are used to release the heat, wherein the heat sink may be mounted to a bottom surface of a package substrate in order to improve the heat release.

In general, the LED does not have a high resistance property against a static electricity, and thus the designs or measures for protecting the LED from such stress attributed to the static electricity may be employed (see, Patent Literature 1). For example, a Zener diode may be provided in electrically parallel connection with the LED. This can reduce the stress of the LED upon the applying of the overvoltage or overcurrent to the LED. However, in a case of a surface-mounted type LED package 200 as illustrated in FIG. 26, the Zener diode element 270 is disposed on a package substrate 210 such that it is in reversely parallel connection with the LDE element 220. The disposition of the Zener diode element 270 on the substrate makes the size of the entire package larger. That is, a further downsizing of the LED package cannot be achieved.

PATENT DOCUMENTS

Prior Art Patent Documents

PATENT DOCUMENT 1: JP-A-2009-129928

DISCLOSURE OF THE INVENTION

Problems to be Solved by the Invention

The present invention has been created in view of the above circumstances. In other words, in light of a need for a compact LED package with a satisfactory heat-releasing performance, an object of the present invention is to provide a light-emitting element substrate which suitably satisfies the above need, and also provide a light-emitting device equipped therewith.

Means for Solving the Problem

In order to achieve the above object, the present invention provides a substrate for a light-emitting element, including a mounting surface on which a light-emitting element is to be mounted, the mounting surface being one of two opposed main surfaces of the substrate:

wherein the substrate for the light-emitting element is provided with a "protection element for the light-emitting element", the protection element comprising a voltage-dependent resistive layer embedded in the substrate, and a first electrode and a second electrode each of which is in connection with the voltage-dependent resistive layer; and wherein the light-emitting element is to be mounted such that it is positioned in an overlapping relation with the voltage-dependent resistive layer.

The light-emitting element substrate according to the present invention is characterized at least in that the voltage-dependent resistive layer of the protection element is in an embedded state within the substrate to be positioned in the overlapping relation with the light-emitting element to be mounted. In other words, one of the features regarding the light-emitting element substrate according to the present invention is that the voltage-dependent resistive layer of the protection element is embedded in the mounting area for the light-emitting element.

The term "light-emitting element" used in the present description substantially means an element capable of emitting light. Examples of the light-emitting element include a light-emitting diode (LED) and an electronic component equipped therewith. Accordingly, the term "light-emitting element" in the present invention means not only a "bare chip type LED (i.e., LED chip)" but also a "discrete type light-emitting element wherein a molding of the LED chip is provided for an easy packaging thereof with respect to the substrate". The LED chip may also be a semiconductor laser chip.

The term "voltage-dependent resistive layer" used in the present description substantially means a layer capable of changing its resistive property according to a voltage to be applied thereto. The voltage-dependent resistive layer may be one in which the high electrical resistance is provided in the range of the low voltage applied across the electrodes disposed on both sides thereof, whereas the electrical resistances sharply drops if the higher voltage is applied. This means that the voltage-dependent resistive layer can have a nonlinearity relationship between the applied voltage and the resistance value. In an embodiment according to the present invention, the voltage-dependent resistive layer may be in the form of "single layer".

The term "substrate" used in the present description substantially means a member to be used as a platform for mounting the light-emitting element. Therefore, the examples of the substrate include not only a "plate member which has a substantially flat form" but also a "member having a recessed portion in its main surface to accommodate the LED chip and the like therein".

In one preferred embodiment, a surface of the voltage-dependent resistive layer is in the same plane as the one of the two opposed main surfaces of the substrate, and thereby the surface of the voltage-dependent resistive layer forms a part of the mounting surface. In other words, the substrate for light-emitting element according to the present invention may be configured such that the upper surface of the voltage-dependent resistive layer of the protection element is substantially flush with the mounting surface of the substrate. Alternatively, the surface of the voltage-dependent resistive layer is in the same plane as the other of the two opposed main surfaces of the substrate. In other words, the substrate for light-emitting element according to the present invention may be configured such that the lower surface of the voltage-dependent resistive layer of the protection element is substantially flush with the back surface of the substrate.

In one preferred embodiment, the first electrode of the protection element is positioned in contact with a substrate exposure surface of the voltage-dependent resistive layer; and whereas the second electrode of the protection element is positioned such that it is in contact with a substrate embedment surface of the voltage-dependent resistive layer in an opposed relation to the first electrode, or the second electrode is accommodated in the voltage-dependent resistive layer in an opposed relation to the first electrode. In other words, the substrate for light-emitting element according to the present invention may be configured such that the first electrode of the protection element is disposed on the surface of the substrate to make contact with the light-emitting element to be mounted, whereas the second electrode of the protection element, which is opposed to the first electrode, is disposed in the interior of the substrate in a partial contact or entire contact with the voltage-dependent resistive layer. For example, the first electrode of the protection element is disposed on the surface of the substrate to make contact with the light-emitting element to be mounted, and while on the other hand the second electrode of the protection element is disposed in the interior of the substrate such that it is layered on the voltage-dependent resistive layer in an opposed relation to the first electrode. Alternatively, the first electrode of the protection element may be disposed on the surface of the substrate to make contact with the light-emitting element to be mounted, and while on the other hand the second electrode of the protection element is disposed in the interior of the substrate such that it is included in the voltage-dependent resistive layer in an opposed relation to the first electrode (in this case, the second electrode inside the voltage-dependent resistive layer is not necessarily singular, but may be plural). The phrase "substrate exposure surface of the voltage-dependent resistive layer" used in the present description means an exposed surface of the voltage-dependent resistive layer, which is exposed at the surface of the substrate.

In one preferred embodiment, the second electrode, which is disposed in the interior of the substrate, is in connection with an electrode or metal layer (or wiring pattern being in an electrical connection with the electrode) provided on the one (i.e., mounting surface) or the other (i.e., back surface opposed to the mounting surface) of the two opposed main surfaces via a via hole which extends within the substrate between the voltage-dependent resistive layer and the one (i.e., mounting surface) or the other (i.e., back surface opposed to the mounting surface) of the two opposed main surfaces. In this embodiment, the second electrode can have a form of "through electrode".

In one preferred embodiment, the first electrode has a divided form wherein the divided two pieces of the first electrode are positioned on the surface of the voltage-dependent resistive layer. In other words, the first electrode is disposed in a divided form into two-pieces wherein such two pieces of the first electrode are positioned on a substrate surface including the "substrate exposure surface of voltage-dependent resistive layer" or "mounting surface of substrate".

In one preferred embodiment, the protection element used for the light-emitting element is a varistor element. It is preferred in this embodiment that the first electrode of the varistor has a divided form wherein the divided two pieces of the first electrode are positioned on the surface of the voltage-dependent resistive layer (i.e., "substrate exposure surface of the resistive layer" or "mounting surface of the substrate"), and that the serially-connected two varistor elements share the second electrode positioned on the substrate embedment surface of the voltage-dependent resistive layer. This means that the varistor element is composed of a sub-varistor A and a sub-varistor B wherein a first electrode A corresponding to one of the two electrodes of the sub-varistor A and a first electrode B corresponding to one of the two electrodes of the sub-varistor B are positioned on the mounting surface of the substrate. While on the other hand, a second electrode A corresponding to the other of the two electrodes of the sub-varistor A and a second electrode B corresponding to the other of the two electrodes of the sub-varistor B are electrically interconnected in the embedded state within the substrate (it is particularly preferred that the second electrode A of the sub-varistor A and the second electrode B of the sub-varistor B integrally form a single layer). The above structure of the varistor can be referred to as "double-varistor structure" since two of the varistor elements are provided as a component of the substrate.

In such "double-varistor structure", a positive electrode of the light-emitting element is to be in connection with one of the divided two pieces of the first electrode, whereas a negative electrode of the light-emitting element is to be in connection with the other of the divided two pieces of the first electrode. Consequently, the two pieces of varistor elements serially connected to each other (i.e., the sub-varistor element A and the sub-varistor element B) are in an electrically parallel connection with the light-emitting element.

In one preferred embodiment, the protection element for the light-emitting element is a multilayer varistor. Even in this embodiment, the voltage-dependent resistive layer of the multilayer varistor is in an embedded state at the substrate mounting area for the light-emitting element. It is preferred that a surface of the voltage-dependent resistive layer of the multilayer varistor is in the same plane as the one of the two opposed main surfaces of the substrate, and thereby the surface of such voltage-dependent resistive layer forms a part of the mounting surface in the substrate. This means that, preferably, the upper surface of the voltage-dependent resistive layer of the multilayer varistor is substantially flush with the mounting surface of the substrate.

In one preferred embodiment, the substrate has a two-layered structure composed of an upper layer and a lower layer made of different materials from each other. In this embodiment, the upper layer defines the mounting surface and also it comprises the voltage-dependent resistive layer embedded therein. It is preferred that the upper layer and the lower layer made of different materials from each other have different heat conductivities from each other. In light of the heat releasing from the substrate, it is preferred that the heat conductivity of the lower layer is higher that the heat conductivity of the upper layer. For example, the material for the upper layer of the substrate may be a glass ceramic, whereas the material for the lower layer of the substrate may be an alumina. Alternatively, the material for the upper layer of the substrate may be a glass ceramic, whereas the material for the lower layer of the substrate may be an aluminum nitride.

The present invention also provides a light-emitting device equipped with the above-described substrate. More specifically, the present invention provides the light-emitting device comprising the light-emitting element substrate as described above and a light-emitting element mounted on the mounting surface of the substrate.

The term "light-emitting device" used in the present description substantially means a light-emitting element package (especially "LED package"). This term (i.e., "light-emitting device") also means "product with a plurality of LEDs arranged in a form of array".

In one preferred embodiment regarding the light-emitting device, the light-emitting element is a LED chip equipped with a positive electrode and a negative electrode on its surface which is opposed to a light-emitting surface of the LED chip, and the LED chip is in a mounted state on the mounting surface of the substrate in a manner of flip-chip.

Furthermore, the present invention also provides a method for manufacturing the above-described substrate. More specifically, the present invention provides the method for manufacturing the light-emitting element substrate including a varistor element composed of a voltage-dependent resistive layer and first and second electrodes each of which is in an electrical connection with the voltage-dependent resistive layer. Such manufacturing method comprises the steps of:

(A) forming a second electrode precursor layer on a main surface of a green sheet;

(B) pressing the second electrode precursor layer into the green sheet from above by means of a convex-shaped die, and thereby forming a recessed portion in the green sheet with the second electrode precursor layer disposed on a bottom surface of the recessed portion;

(C) disposing the voltage-dependent resistive layer in the recessed portion thus formed (i.e., disposing the voltage-dependent resistive layer on the second electrode precursor layer positioned in the bottom surface of the recessed portion);

(D) sintering the green sheet with the voltage-dependent resistive layer and the second electrode precursor layer disposed in the recessed portion thereof, and thereby producing a substrate with the voltage-dependent resistive layer and the second electrode embedded therein; and (E) forming a metal layer on the substrate and then subjecting the metal layer to a patterning process, and thereby forming the first electrode in contact with the voltage-dependent resistive layer.

The manufacturing method according to the present invention is characterized at least in that the voltage-dependent resistive layer which has been beforehand formed is used. This makes it possible to produce the substrate having a satisfactory voltage-dependent resistive characteristic of the varistor element disposed therein.

The various modified embodiments regarding the manufacturing method of the present invention are possible. For example, instead of the steps (A) and (B), another step is performed wherein a recessed portion is formed in a main surface (i.e., mounting surface) of a green sheet by means of a convex-shaped die by pushing the die into the green sheet, in which case, the voltage-dependent resistive layer having a second electrode precursor layer formed on a lower surface thereof is disposed in the recessed portion of the green sheet in the step (C).

In another preferred modified embodiment, instead of the steps (B) and (C), another step is performed wherein the voltage-dependent resistive layer is pressed into the green sheet via the second electrode precursor layer, and thereby forming a recessed portion in the green sheet while disposing the voltage-dependent resistive layer and the second electrode precursor layer in the recessed portion. Namely, the voltage-dependent resistive layer is pressed into the green sheet via the second electrode precursor layer so that the voltage-dependent resistive layer and the second electrode precursor layer are embedded into the green sheet.

In still another preferred modified embodiment, instead of the steps (A) to (C), another step is performed wherein the voltage-dependent resistive layer having a second electrode precursor layer formed thereon is pressed into a green sheet under such a condition that the second electrode precursor layer is positioned beneath the voltage-dependent resistive layer, and thereby forming a recessed portion in the green sheet while disposing the voltage-dependent resistive layer and the second electrode precursor layer in the recessed portion. Namely, the voltage-dependent resistive layer having a second electrode precursor layer formed thereon is pressed into a green sheet under such a condition that the second electrode precursor layer is positioned beneath the voltage-dependent resistive layer, and thereby the voltage-dependent resistive layer and the second electrode precursor layer are embedded into the green sheet.

In still another preferred modified embodiment, instead of the steps (A) to (C), another step is performed wherein "voltage-dependent resistive layer accommodating the second electrode in an interior thereof" is disposed on a main surfaces of a green sheet, and the voltage-dependent resistive layer is pressed into the green sheet from above by means of a convex-shaped die, and thereby forming a recessed portion in the green sheet with "voltage-dependent resistive layer accommodating the second electrode in the interior thereof" disposed in a bottom surface of the recessed portion. In this embodiment, the green sheet with the "voltage-dependent resistive layer accommodating the second electrode in the interior thereof" disposed in the bottom surface of the recessed portion is sintered in the step (D), and thereby producing the substrate with the voltage-dependent resistive layer and the second electrode embedded therein.

Effect of the Invention

The substrate for light-emitting element according to the present invention is configured such that the voltage-dependent resistive layer of the protective element is embedded in an overlapping relation with the mounting surface for the light-emitting element to be mounted. This leads to an achievement of a compact-sizing as a light-emitting device (e.g., LED package) using the substrate. Accordingly, the substrate for light-emitting element according to the present invention is suitable as the packaging substrate in various purposes (e.g., in the lighting use), and it can effectively contribute to the down-sizing of an end product.

Further, the substrate for light-emitting element according to the present invention has such a configuration that the protection element (especially, voltage-dependent resistive layer and one of the electrodes, occupying a larger volume in the protection element) is substantially eliminated from the surface of the substrate. This makes it possible to save a space for the other components disposed on the surface of the substrate. For example, there can be formed the spaces for the electrodes and metal patterns to be provided on the mounting surface of the substrate. The electrodes and the metal patterns are connected with the light-emitting element which generates the heat, and they are made of a material with a high thermal conductivity (e.g., copper), which effectively contributes to the heat releasing from the light-emitting element product. In accordance with the present invention, the space formed due to the "embedding" of the protection element can contribute to larger size and thicker dimension of the electrodes and the metal patterns capable of releasing the heat, and thereby the heat-releasing performance can be effectively improved in the light-emitting element product.

Furthermore, in accordance with the present invention, the substrate with satisfactory heat-resisting and heat-releasing properties can be used (for example, ceramic substrate can be used) as the light-emitting element substrate with the voltage-dependent resistive layer embedded therein. This also makes it possible to improve the heat-releasing performance in the substrate.

The substrate for light-emitting element according to the present invention is configured such that the protection element is embedded without increasing of the thickness of the substrate. The reason for this is that, under the condition of the embedding of the protection element (more specifically, the voltage-dependent resistive layer and the one of the electrodes of the varistor element) in the substrate, the voltage-dependent resistive layer can be in a form of a single layer. Therefore, a thinning of the light-emitting element substrate with the protection element accommodated therein is achieved, and thereby the heat from the light-emitting element can be released to the outside, which leads to an improvement of the heat releasing performance in the light-emitting element product.

In general, the luminous efficiency (i.e., a ratio of the driving current being converted into the light) of the light-emitting element (especially, the LED) tends to be decreased with increased temperature, and thus the brightness of the light-emitting element becomes lowered when the temperature rises. In this regard, according to the present invention, the substrate with the improved luminous efficiency and brightness can be provided since it has an excellent performance of the heat releasing. Moreover, the substrate according to the present invention has such an excellent heat releasing performance that an operation life of the LED can be prolonged and also the degradation and/or color change of a sealing resin, which may be attributed to the heat, can be effectively prevented.

BRIEF DESCRIPTION OF THE DRAWINGS

FIG. 1 includes a perspective view and a cross-sectional view schematically illustrating a substrate for light-emitting element according to the present invention.

FIG. 7 includes cross sectional views schematically illustrating a light-emitting device (i.e., LED package) according to an embodiment "Disposition in recessed-portion".

FIG. 8 includes cross sectional views schematically illustrating a light-emitting device (i.e., LED package) according to an embodiment "Built-in multilayer varistor".

FIG. 10 includes cross sectional views schematically illustrating an embodiment "Heterogeneous ceramic substrate".

FIG. 12 includes cross-sectional views showing the steps in a manufacturing process of a carrier film with the voltage-dependent resistive layers provided thereon.

FIG. 18 includes cross-sectional views showing the steps in a manufacturing process with respect to an embodiment "Use of electrode-accommodated resistive layer".

FIG. 19 includes cross sectional views schematically illustrating a process for producing a substrate with a plurality of protection elements disposed in a form of array.

FIG. 23 is a cross sectional view schematically illustrating a voltage-dependent resistive layer embedded in the substrate such that the resistive layer partially overlaps with a mounting region for the light-emitting element.

FIG. 24 illustrates an example of an LED product according to the present invention.

DETAILED DESCRIPTION OF THE INVENTION

Figure 2:
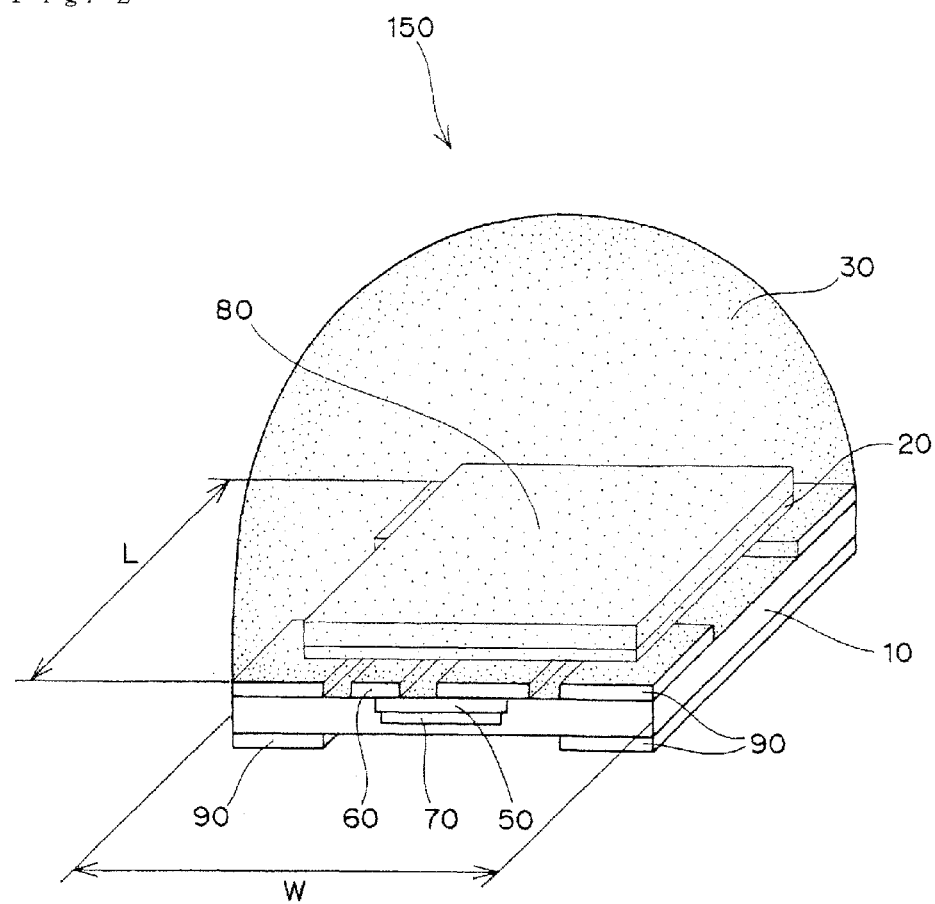
FIG. 2 is a perspective view schematically illustrating a light-emitting device (i.e., LED package) according to the present invention.

A substrate for light-emitting element and a manufacturing method thereof according to the present invention will be hereinafter described in more detail. The explanation about a light-emitting device according to the present invention is included in the description of the substrate for light-emitting element and the manufacturing method thereof. It should be noted that various components or elements are schematically shown in the drawings wherein their dimensional proportions and their appearances are not necessarily real ones, and are merely for the purpose of making it easy to understand the present invention.

[Substrate for Light-Emitting Element of the Present Invention]

In the substrate for light-emitting element according to the present invention, a voltage-dependent resistive layer of the protection element is embedded in a substrate region in an overlapping relation with the light-emitting element to be mounted thereon. More specifically, as illustrated in FIG. 1, the voltage-dependent resistive layer 50 of the protection element is in an embedded state at the mounting area 25 for the light-emitting element within the substrate 100. In the present invention, the voltage-dependent resistive layer 50 may be embedded such that it at least partially overlaps the light-emitting element mounting region 25. Thus, in some cases, only a part of the voltage-dependent resistive layer 50 may be overlapped with the light-emitting element mounting region 25.

The body 10 of the substrate for light-emitting element may be made of any materials, i.e., may be made of a material which can be used for a substrate of a general LED package. However, in view of an improvement of the heat releasing performance in the light-emitting device, it is preferred that the substrate is made of a material having the desired heat conductivity. Examples of the material having the desired heat conductivity include a metal, a ceramic, a composite material and a thermally conductive filler-containing resin. Among those, the ceramic is particularly suitable material for the substrate on which the light-emitting element generating the heat is mounted, since it has the higher heat conductivity and the less thermal expansion coefficient. Further in light of the fact that the ceramic substrate (e.g., LTCC substrate) can be obtained with ease by sintering the green sheet, the ceramic is suitable material for the substrate of the present invention.

Figure 26:
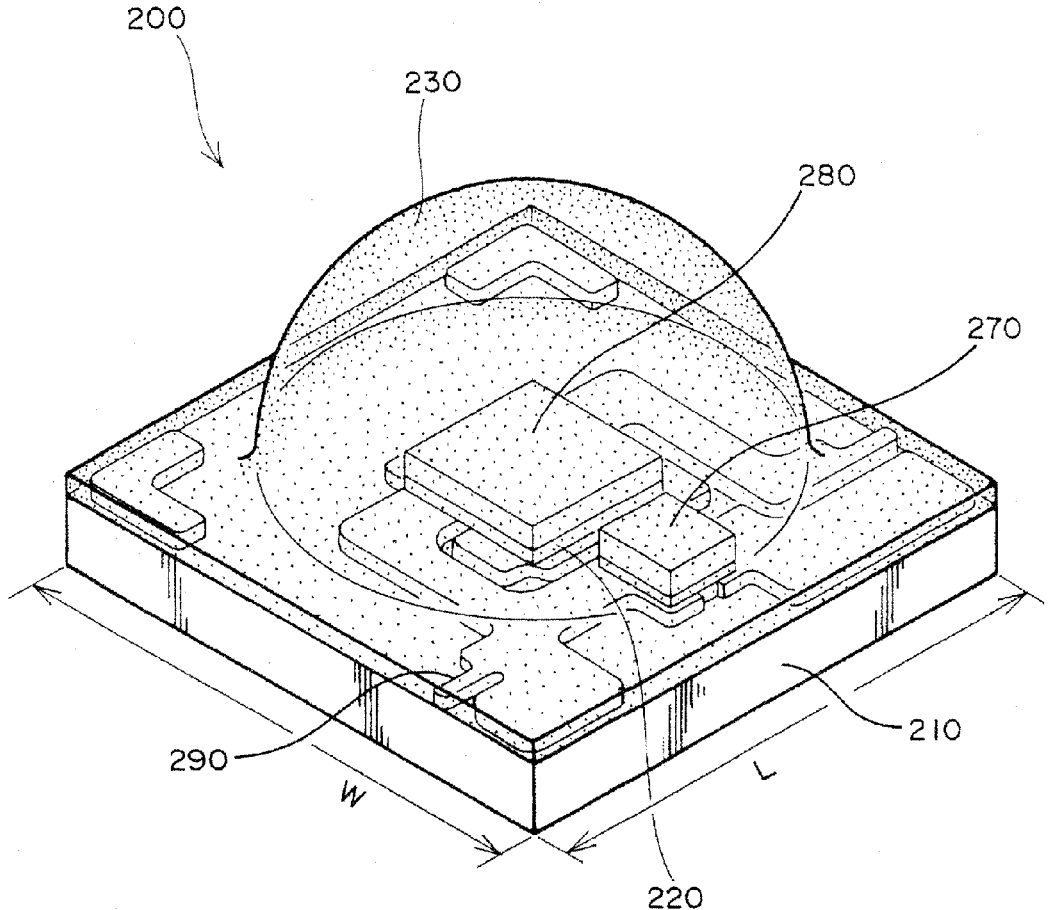
FIG. 26 is a perspective view schematically illustrating a construction of the conventional LED package (PRIOR ART).

In the present invention, a size of the substrate is relatively small since the voltage-dependent resistive layer of the protection element is not disposed on the surface of the substrate, but is embedded within the body 10 of the substrate (specifically, at the mounting region 25 for the light-emitting element). For example in a case of producing an LED package 150 as illustrated in FIG. 2 by using the substrate of the present invention, a size of the main surface (i.e., width "W" and length "L" in FIG. 2) is preferably decreased by 30% to 70%, more preferably by 40% to 60%, in comparison with that of the conventional LED package 200 as illustrated in FIG. 26. As a mere example of the size of the main surface, the conventional compact LED package of FIG. 26 has a size of the main surface in about 2.5 mm to about 4.0 mm×about 2.5 mm to 4.0 mm, whereas the LED package using the substrate of the present invention can have the size of the main surface in about 1.0 mm×about 1.0 mm, which corresponds to the same shape as that of the LED element. Therefore, the substrate for light-emitting element of the present invention can be largely scaled down, and thereby the down-sizing of the light-emitting device (i.e., LED package) equipped with the substrate can be suitably achieved.

According to the present invention, a thin substrate is provided as the light-emitting element substrate in which the protection element is accommodated. For example in a case of the LED package 150 of FIG. 2 in which the substrate of the present invention is used, a thickness of the substrate body 10 can be in the range of about 250 μm to about 400 μm. This comparative thinning of the substrate can lead to a suitable thinning of the light-emitting device (i.e., LED package) equipped with the substrate of the present invention.

A voltage-dependent resistive layer 50 of the protection element may be made of any material as long as the resistance of the layer 50 varies according to a voltage applied thereto. In a case where the protection element is a varistor element, it is typical that the voltage-dependent resistive layer 50 is a layer made of a varistor material. In this regard, the voltage-dependent resistive layer 50, which is made of the varistor material, may be in a form of singular layer as illustrated in FIG. 2. The single layer of the voltage-dependent resistive layer 50 can achieve an accommodating/embedding of the protection element in the substrate without increasing of the substrate thickness. The varistor material for the voltage-dependent resistive layer may be any suitable ones, and thus it may be a material generally used for a chip varistor. For example, a metal-oxide-based material mainly composed of zinc oxide ($ZnO$) or strontium titanate ($SrTiO_3$) can be used as the varistor material. Particularly, the zinc oxide ($ZnO$) has a satisfactory ability to protect the light-emitting element from a surge and the like since the resistance value of the zinc oxide significantly varies according to the value of the applied voltage. Therefore, the zinc oxide can be suitably used as a material for the voltage-dependent resistive layer in the present invention.

The size of the voltage-dependent resistive layer 50 is not particularly limited as long as it is smaller than that of the substrate. In other words, it is preferred that the horizontal width dimensions of the voltage-dependent resistive layer are smaller than those of the main surface of the substrate. For example, a width dimension "w" of the voltage-dependent resistive layer 50 as illustrated in FIG. 1 is preferably in the range of about 20% to about 70% of a width dimension "W" of the substrate, more preferably in the range of about 30% to about 60% thereof. A thickness dimension "t" of the voltage-dependent resistive layer 50 as illustrated in FIG. 1 is preferably in the range of about 10% to about 50% of a thickness dimension "T" of the substrate, more preferably in the range of about 10% to about 40% thereof. The thickness of the voltage-dependent resistive layer can have a correlation with a varistor voltage (in a case where the protection element is the varistor element). Therefore, the thickness of the voltage-dependent resistive layer may be determined according to a desired varistor voltage. For example in a case where the light-emitting element is an LED, the desired varistor voltage is about 10 V or less. In this case, the thickness of the voltage-dependent resistive layer may be determined so as to achieve the varistor voltage of about 10 V or less. In order to protect the light-emitting element from the static electricity, an electrostatic capacitance is required to some extent in the voltage-dependent resistive layer (i.e., varistor layer). As the voltage-dependent resistive layer becomes thinner, the electrostatic capacitance becomes larger. Therefore, the thickness of the voltage-dependent resistive layer can be determined according to the desired electrostatic capacitance.

Figure 3:
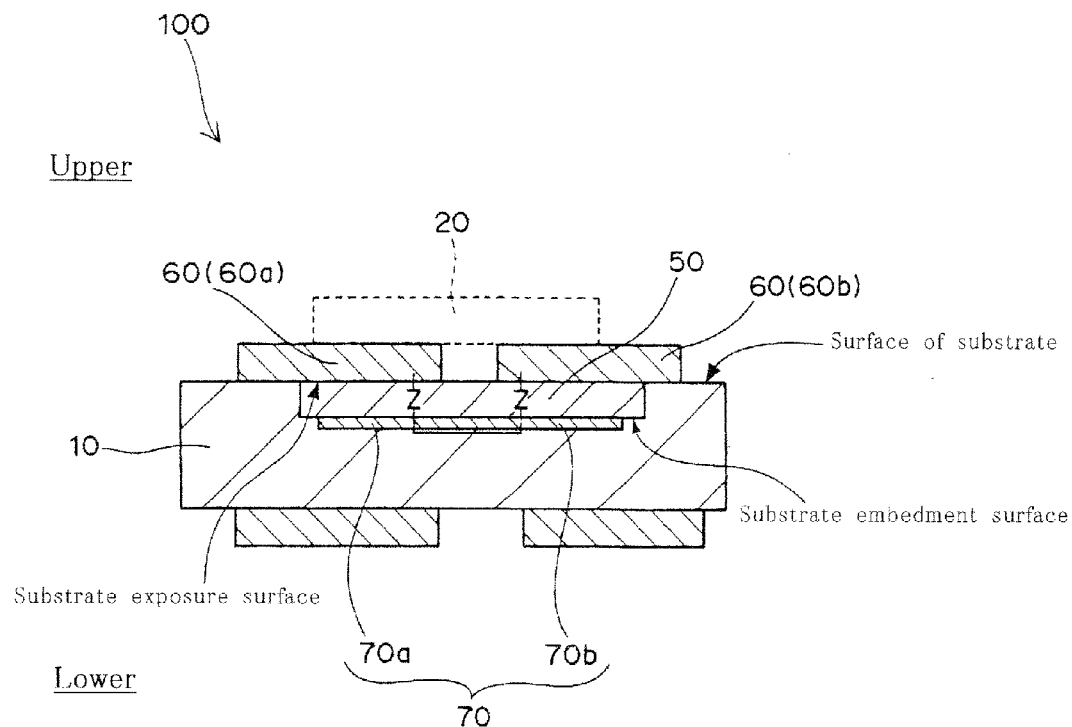
FIG. 3 is a cross-sectional view schematically illustrating a substrate for light-emitting element according to the present invention.

In the substrate 100 of the present invention, a surface of the voltage-dependent resistive layer 50 is preferably positioned in the same plane as the surface of the substrate as illustrated in FIG. 3. More specifically, an upper surface of the voltage-dependent resistive layer 50 is exposed from the substrate so as to be flush with the surface of the substrate. A light-emitting element 20 is to be positioned such that it at least partially overlaps with the substrate exposure surface of the voltage-dependent resistive layer 50. This means that at least a part of the upper surface of the voltage-dependent resistive layer 50 is exposed at the mounting region for the light-emitting element in the substrate.

In the present invention, the voltage-dependent resistive layer 50 is in an exposed state at the surface of the substrate wherein the size of the exposed surface of the resistive layer is relatively small. Preferably, the exposed surface of the voltage-dependent resistive layer 50 has a smaller area than that of the mounting region 25 of the light-emitting element (see, FIG. 1 and the other drawings). For example, the exposed area of the voltage-dependent resistive layer 50 is smaller than that of the mounting region 25 for the light-emitting element preferably by the range of about 20% to about 70%, more preferably by the range of about 30% to about 60%. Since the size of the main surface of the voltage-dependent resistive layer embedded in the substrate body with being flush therewith is smaller than the size of the main surface of the light-emitting element, an adverse effect of a contraction stress upon the sintering of the material for the substrate becomes less, and thereby the warping of the substrate can be effectively reduced. This leads to a precise mounting of the light-emitting element wherein it can be precisely mounted in a manner of flip-chip. Further, a zinc oxide varistor (i.e., the zinc oxide of the voltage-dependent resistive layer) has less bending strength, and thus, by forming the voltage-dependent resistive layer into a size smaller than the size of the main surface of the light-emitting element, the bending strength can be improved as a whole in the package. This means that the package can posses a resistance to a pressure stress upon the flip-chip mounting. Furthermore, in light of the fact that the voltage-dependent resistive layer is relatively expensive, the smaller size of the voltage-dependent resistive layer can lead to the cost saving without impairing the essential performance of the varistor.

As illustrated in FIG. 3, "first electrode 60 of the protection element" is positioned on the exposed surface (i.e., substrate exposure surface) of the voltage-dependent resistive layer 50 such that the first electrode 60 is in an electrical connection with the voltage-dependent resistive layer 50. While on the other hand, "second electrode 70 of the protection element" is positioned on a substrate embedment surface of the voltage-dependent resistive layer 50 in an opposed relation to the first electrode 60 such that the second electrode 70 is in an electrical connection with the voltage-dependent resistive layer 50.

Figure 4:
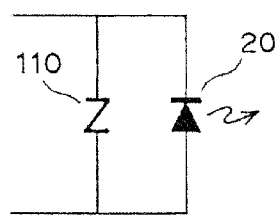
FIG. 4 is a circuit diagram with respect to a light-emitting element and a protection element.

The first and second electrodes 60, 70 of the protection element substantially serve as external electrodes of the protection element, and thus they can contribute to a parallel electrical connection between the protection element and the light-emitting element. In order to allow the parallel electrical connection between the protection element and the light-emitting element to provide a protective function, the first electrode and the second electrode are directly connected to the electrodes of the light-emitting element, respectively, or are electrically connected to wiring patterns (i.e., patterned metal layers) disposed in the substrate. In other words, the first electrode and the second electrode of the protection element, as required, may be in an electrical connection with the wiring patterns (i.e., patterned metal layers) and the like of the substrate to form a typical circuit diagram as illustrated in FIG. 4.

The material for each of the first electrode and the second electrode of the protection element is not particularly limited, and thus may be typical one used for the conventional protection element. For example in a case where the protection element is a varistor element, any typical material used for the varistor electrode can be used for the first electrode and the second electrode of the varistor element. For example, at least one of metal materials selected from the group consisting of silver (Ag), copper (Cu), palladium (Pd), platinum (Pt) and nickel (Ni) can be used as a main material of the first electrode and the second electrode of the varistor element.

Each size of the first electrode 60 and the second electrode 70 of the protection element is not largely limited. In other words, as illustrated in FIG. 3, as long as the first electrode 60 is provided so as to be in contact with the substrate exposure surface of the voltage-dependent resistive layer 50 and the second electrode 70 is provided so as to be in contact with the substrate embedment surface of the voltage-dependent resistive layer 50 in an opposed relation to the first electrode 60, there is no limitation in the sizes of the first electrode 60 and the second electrode 70. For example in a case of the configuration illustrated in FIG. 1, a width dimension "w1" of the first electrode 60 may be in the range of about 0.2 mm to about 0.5 mm, and a width dimension "w2" of the second electrode 70 may be in the range of about 0.3 mm to about 0.5 mm, whereas a thickness dimension "t1" of the first electrode 60 may be in the range of about 50 μm to about 150 μm, and a thickness dimension "t2" of the second electrode 70 may be in the range of about 5 μm to about 20 μm.

The substrate for light-emitting element according to the present invention has such a configuration that the protection element (especially, voltage-dependent resistive layer and the second electrode which occupy a larger volume) is substantially eliminated from the surface of the substrate, making it possible to give a space for other components. Therefore, the present invention can make the first electrode 60 thicker. For example, the thickness of the first electrode can be preferably in the range of about 50 μm to about 200 μm, more preferably in the range of about 60 μm to about 150 μm, most preferably in the range of about 70 μm to about 125 μm. Since the first electrode effectively contributes to the heat releasing because of its high thermal conductivity, the thicker first electrode can effectively improve the heat-releasing effect in the product with the light-emitting element provided therein. Similarly, the present invention can make the larger thickness of the wiring pattern (i.e., patterned metal layer) and the like provided on the mounting surface of the substrate. For example, the thickness of the wiring patter or the like can be in the range of about 50 μm to about 200 μm, preferably in the range of about 60 μm and about 150 μm, and more preferably in the range of about 70 μm to about 100 μm.

In a case where the protection element is the varistor element, the substrate for light-emitting element 100 of the present invention can be configured to have "double-varistor structure" as illustrated in FIG. 3. In the "double-varistor structure", as illustrated in FIG. 3, the first electrode 60 has a divided form wherein the divided two pieces (i.e., 60a and 60b) are positioned on the substrate exposure surface of the voltage-dependent resistive layer 50, whereas the second electrode 70 is composed of two sub-electrodes 70a, 70b in a serial connection with each other to integrally posses them on the substrate embedment surface of the voltage-dependent resistive layer 50. Particularly, it is preferred that the second electrode 70 composed of the two sub-electrodes 70a and 70b has a form of a singular layer as a whole, as illustrated in FIG. 3. The "double-varistor structure" can improve the varistor performance while providing the substrate with a relatively simple configuration. Therefore, the "double-varistor structure" is suitable as a substrate structure in the package. Further, with respect to the "double-varistor structure", it has a form of the two varistor elements substantially embedded in the substrate at the light-emitting element mounting region in spite of the serial interconnection of the two varistor elements. This leads to a suitable down-sizing and thinning of the LED package as a whole. The substrate with the varistor structure is also characterized in that the electrodes can be disposed in the surface layer of the substrate with a remarkably simple structure.

The light-emitting device equipped with the substrate of the present invention includes the light-emitting element mounted on the mounting surface of the substrate for light-emitting element. For example, the light-emitting device may be a LED package 150 as illustrated in FIG. 2. The LED package 150 may be a surface-mounted type package product wherein a LED chip equipped with a positive electrode and a negative electrode on its surface which is opposed to a light-emitting surface of the LED chip is in a mounted state on the mounting surface of the substrate in a manner of flip-chip. The LED chip may be one used in a general LED package, and thus it can be suitably selected according to the use application of the LED package.

The light-emitting device (i.e., LED package) according to the present invention has the protection element suitably incorporated in the substrate. Thus, the LED in the light-emitting device can be protected from the static electricity and the surge voltage while keeping the inherent characteristic of the LED chip, and also an erroneous action of the LED can be prevented in the light-emitting device.

As illustrated in FIG. 2, the LED package 150 has a phosphor layer 80 formed on the LED chip 20. The phosphor layer 80 may be any one as long as it can produce a desired light by receiving the light from the LED chip 20. In other words, a kind of phosphor material of the phosphor layer may be determined in view of the light or electromagnetic wave from the light-emitting element. For example, in a case where the LED package is used as a white-lightning LED package, bright white color light can be produced when the phosphor layer includes phosphor material capable of generating yellow-based color by the blue color attributed to the LED chip. In another case where the electromagnetic wave emitted from the LED chip is ultraviolet rays, the phosphor material capable of directly producing the white light by such ultraviolet rays may be used.

The LED package 150 illustrated in FIG. 2 is equipped with the metal layers (i.e., pattern wiring layers) 90 disposed on the substrate. It is preferred that the metal layers are provided in an electrical connection with the respective ones of a positive electrode and a negative electrode of the LED chip so as to allow the electrical current to flow through the LED chip. It is also preferred that the metal layers are provided in an electrical connection with the first and second electrodes of the protection element so as to establish a parallel electrical communication between the protection element and the light-emitting element. If required, an electrical continuity may also be established between the metal layer on the upper surface of the substrate and the metal layer on the back surface of the substrate via "via holes", "through holes" or "metal layers which extend around the side face of the substrate". The metal layers provided on the back surface of the substrate may serve for the mounting of the LED package with respect to the other electric component, or may also serve to release the heat as a heat sink.

As illustrated in FIG. 2, a light-emitting side of the LED package 150 is covered with a sealing resin 30. That is, the LED chip 20 and the metal layers 90 are covered as a whole with the sealing resin 30. The sealing resin 30 may be made of any material, e.g., the material used in a general LED package. For example, the sealing resin 30 may be made of a transparent epoxy resin or a translucent white epoxy resin. Preferably, the sealing resin 30 has a lens shape as illustrated in FIG. 2 in order to enhance an utilization efficiency of the light.

The various modified embodiment are possible with respect to the LED package product according to the present invention. The detailed explanation about this will be described.

(Substrate Back Face-Embedment of Voltage-Dependent Resistive Layer)

Figure 5:
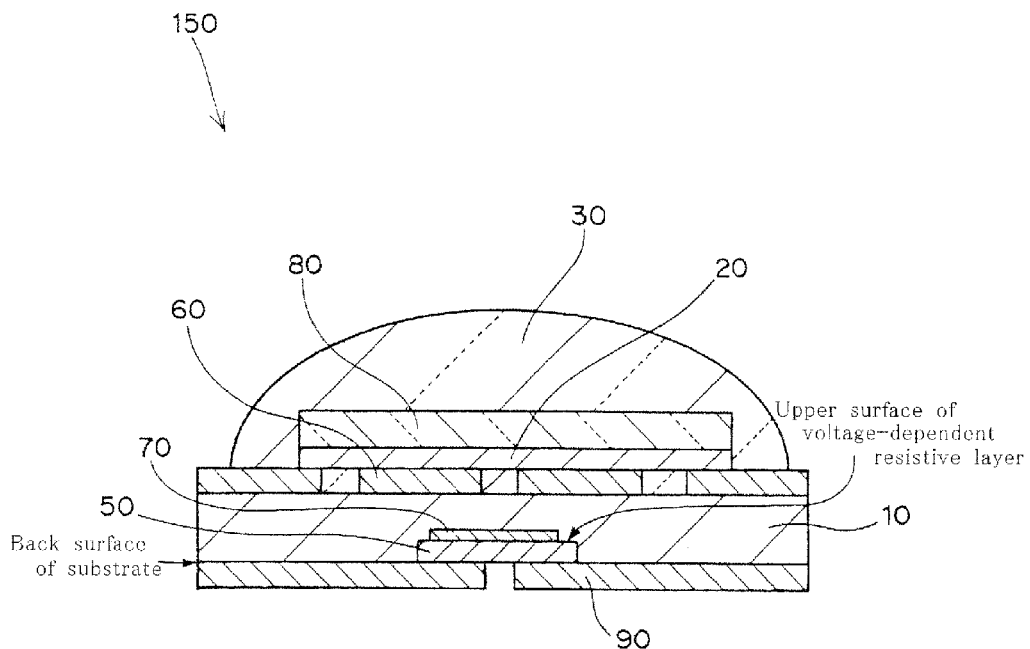
FIG. 5 is a cross-sectional view schematically illustrating a light-emitting device (i.e., LED package) according to an embodiment "Substrate back face-embedment of voltage-dependent resistive layer".

FIG. 5 illustrates the LED package 150 according to an embodiment "substrate back face-embedment of voltage-dependent resistive layer". As illustrated in FIG. 5, the voltage-dependent resistive layer 50 of the protective device (e.g., varistor element) is embedded such that the resistive layer 50 is flush with the back face of the substrate. In other words, the voltage-dependent resistive layer 50 is in the same plane with the bottom surface of the substrate. The second electrode 70 is positioned in contact with the upper surface of the voltage-dependent resistive layer 50. In this LED package, the electrical continuity is established between "metal layers on the top surface of the substrate" and "metal layers on the bottom surface of the substrate" by means of the via holes, the through holes or the metal layers extending around the side surface of the substrate. According to this embodiment, the LED package can be kept at a lower temperature, compared with the case of the package with the voltage-dependent resistive layer embedded immediately below the light-emitting element, and thereby a current leakage attributed to the temperature of the voltage-dependent resistive layer can be prevented, which leads to an improved efficiency in the package.

(Through Electrode)

Figure 6:
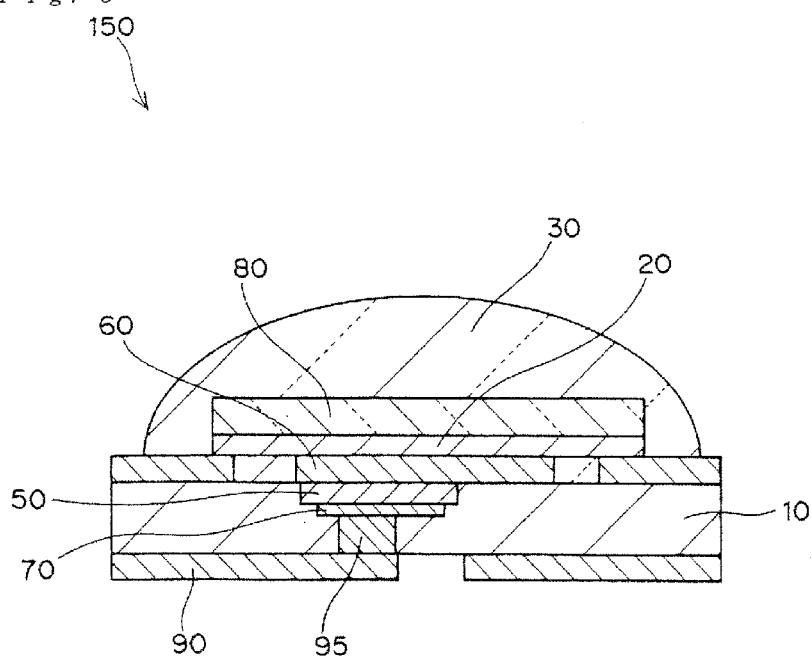
FIG. 6 is a cross-sectional view schematically illustrating a light-emitting device (i.e., LED package) according to an embodiment "Through-electrode".

FIG. 6 illustrates the LED package 150 according to an embodiment "through-electrode". As illustrated in FIG. 6, the second electrode 70 positioned in interior of the substrate is in a connection with the electrode and the metal layers 90 positioned on the back surface of the substrate by means of the via holes 95 extending in the interior of the substrate between the voltage-dependent resistive layer 50 and the back surface of the substrate. According to this embodiment, there is provided an advantageous effect wherein the voltage-dependent resistive layer is not exposed at the surface of the substrate, and thereby the deterioration of the resistance property can be prevented upon subjecting the electrode layer to the Au-plating treatment. Further, another advantageous effect is also provided wherein the increased throughput can be prevented since the through electrode can be formed by a process which is the same as a through-hole formation process for establishing the electrical connection between the through hole and the electrode serving as an electrical connection with the mounting surface side.

(Disposition in Recessed-Portion)

FIGS. 7(a) to 7(c) illustrate the LED package 150 according to an embodiment "disposition in recessed-portion". As illustrated, the voltage-dependent resistive layer 50 and the second electrode 70 are provided within a recessed portion 15 formed in the main surface of the substrate. The LED package 150 according to the embodiment "disposition in recessed-portion" is substantially the same as the embodiment described above, but it has a characteristic feature attributed to a difference in the manufacturing process. More specifically, the LED package having the above described configuration is obtained by embedding the voltage-dependent resistive layer 50 and a second electrode precursor layer 70' in a green sheet 10', followed by the sintering of the green sheet 10' (for example, see the following description with reference to FIG. 8), while on the other hand, the LED package 150 according to the embodiment "disposition in recessed-portion" is obtained by using of the substrate (sintered substrate) with the recessed portion 15 formed in advance (see the following description with reference to FIG. 14). Therefore, according to the embodiment "disposition in recessed-portion", there is provided an advantageous effect wherein the voltage-dependent resistive layer 50 is not substantially affected by the heat and thus a better performance of the protection element can be provided.

With respect to the embodiment "disposition in recessed-portion", a configuration of FIG. 7(a) corresponds to the configurations of FIGS. 1 through 3. A configuration of FIG.

7(b) corresponds to the configuration of FIG. 5. A configuration of FIG. 7(c) corresponds to a combination of the configurations of FIGS. 5 and 6.

The following embodiments are also possible in the present invention.

(Built-in Multilayer Varistor)

Figure 20:
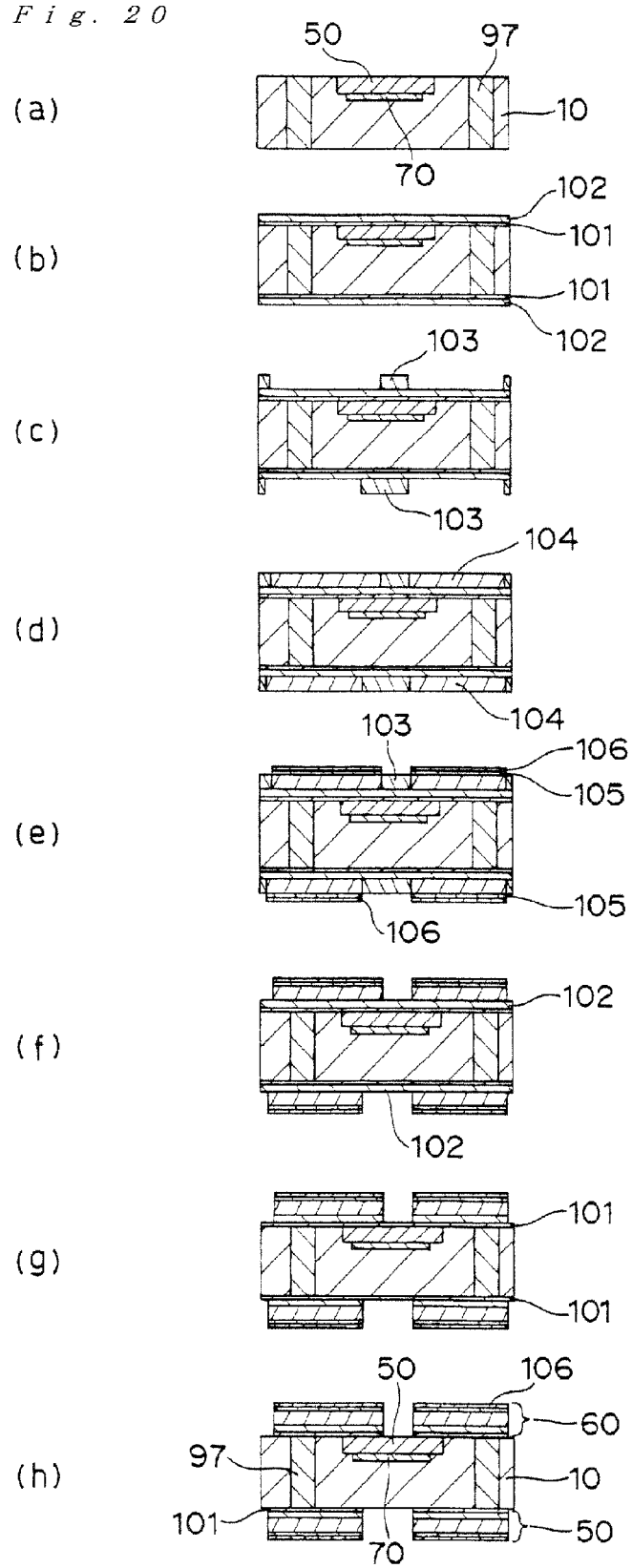
FIG. 20 includes cross sectional views schematically illustrating a process which can be replaced with the process of FIG. 19.

FIG. 8(a) illustrates the LED package 150 according to an embodiment "built-in multilayer varistor". As illustrated, the voltage-dependent resistive layer 50 has a substantially laminated form. More specifically, a plurality of interior electrodes (70A$_1$ and 70A$_2$) are positioned within the voltage-dependent resistive layer 50, and external electrodes (71A$_1$ and 71A$_2$) positioned outside the voltage-dependent resistive layer 50 are in an electrical connection with the internal electrodes (70A$_1$ and 70A$_2$). In this embodiment, the internal electrodes (70A$_1$ and 70A$_2$) correspond to the second electrode of the present invention. The LED package 150 according to the embodiment "built-in multilayer varistor" can be obtained through the embedding of a chip varistor of FIG. 8(b) into the substrate. According to this embodiment, there is provided an advantageous effect wherein a large static electricity withstand can be provided due to the large electrode area of the multilayer varistor. As illustrated in FIG. 8(c), a Ni thin layer 105 and an Au thin layer 106 are disposed on a surface of the first electrode 60. This is due to the manufacturing process wherein the Ni thin layer 105 and the Au thin layer 106 are used as a "resist" upon the formation of the first electrode and the copper wiring (which will be described in detail with reference to FIG. 20).

(Embedding of Second Electrode in the Interior of Voltage-Dependent Resistive Layer)

Figure 9:
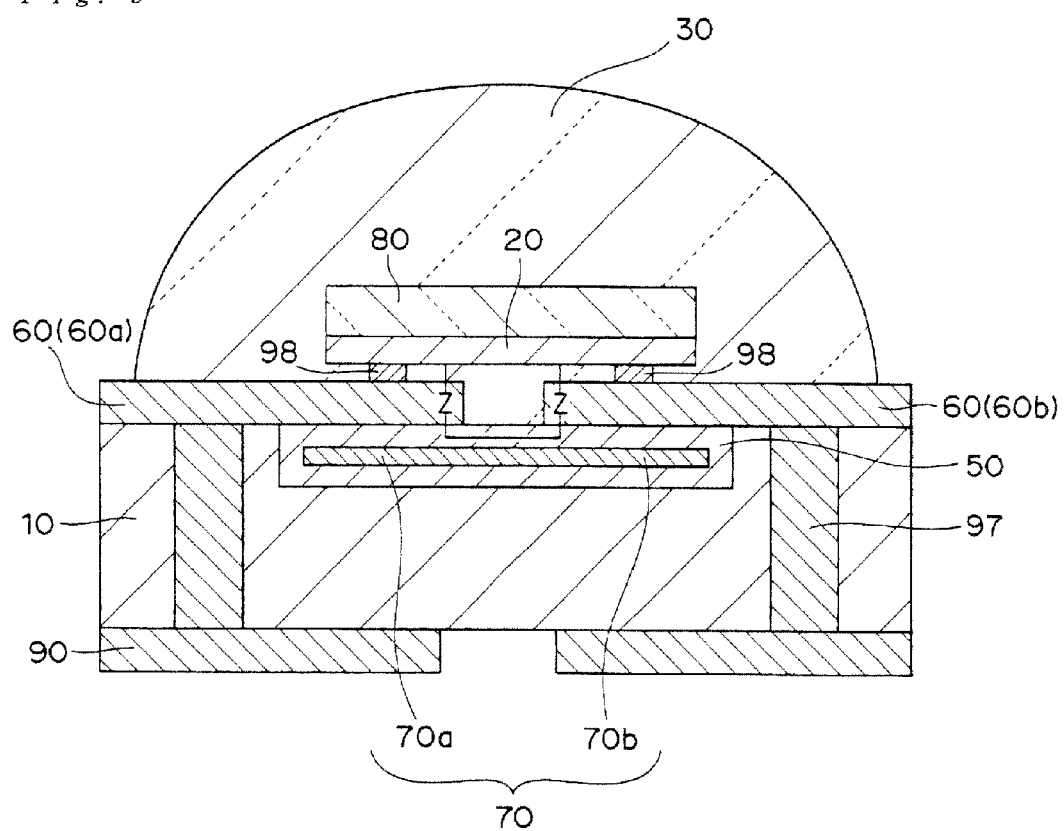
FIG. 9 is a cross sectional view schematically illustrating an embodiment "Embedding of second electrode in the interior of voltage-dependent resistive layer".
Figure 11:
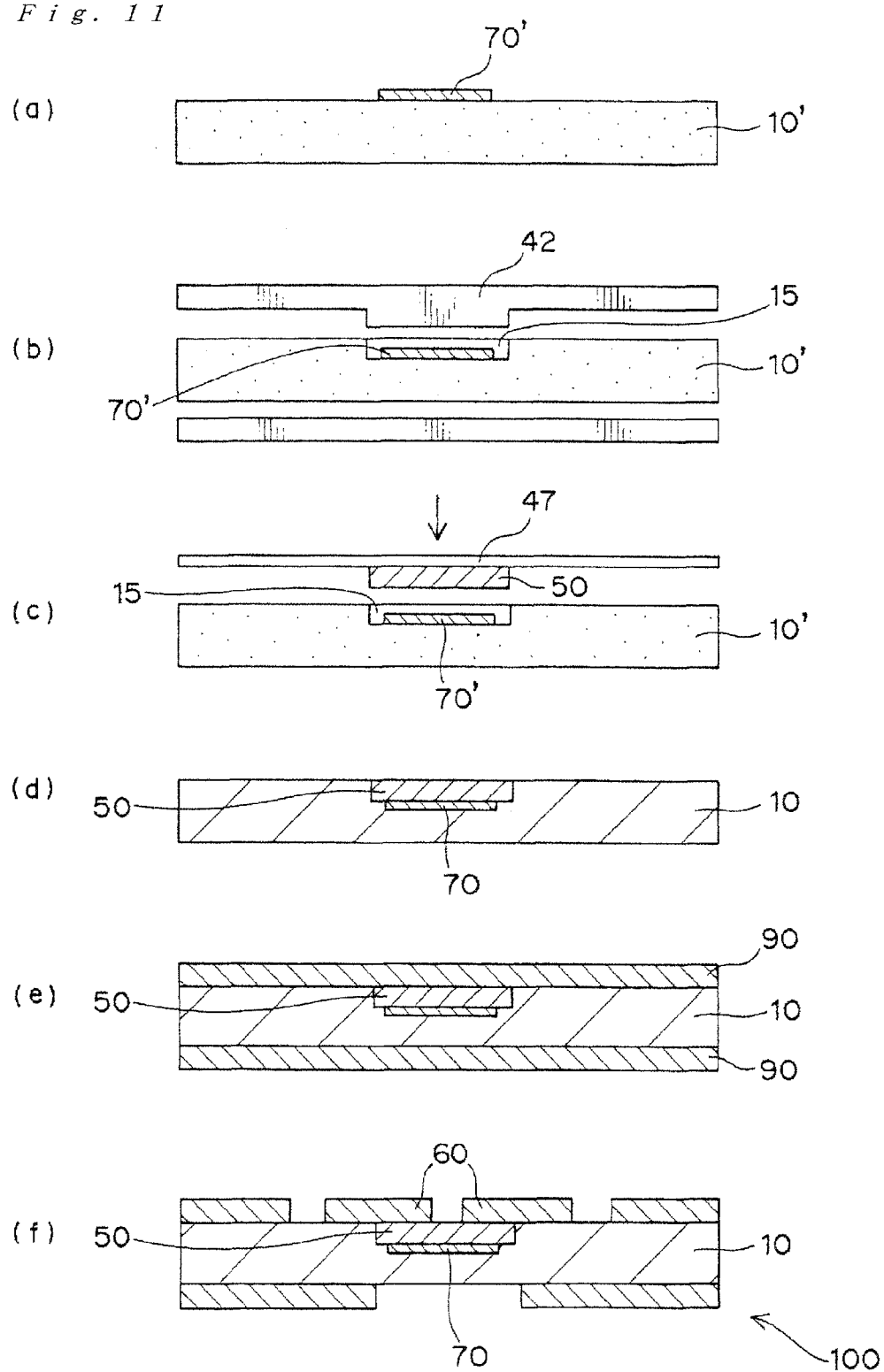
FIG. 11 includes process-cross sectional views schematically illustrating a manufacturing method of a light-emitting element substrate according to the present invention.

FIG. 9 illustrates the LED package 150 according to an embodiment "embedding of second electrode in the interior of voltage-dependent resistive layer". As illustrated, the second electrode 70 is in an embedded state within the voltage-dependent resistive layer 50. Namely, according to the embodiment, the first electrode 60 is positioned in contact with the substrate exposure surface of the voltage-dependent resistive layer 50, whereas the second electrode 70 is positioned in the interior of the voltage-dependent resistive layer 50. This embodiment can also provide the package with the "double-varistor structure". As illustrated in FIG. 9, the first electrode 60 has a divided form wherein the two pieces (60a and 60b) of the divided electrode are positioned on the substrate exposure surface of the voltage-dependent resistive layer 50, whereas the second electrode 70 is composed of two sub-electrodes 70a, 70b in a serial connection with each other to integrally posses them in the interior of the voltage-dependent resistive layer 50 (it is preferred in this embodiment that the second electrode 70 composed of the two sub-electrodes 70a and 70b has a form of a singular layer as a whole, as illustrated in FIG. 9). According to this embodiment wherein the second electrode 70 is in an embedded state in the interior of voltage-dependent resistive layer, there is provided an advantageous effect wherein a deterioration of the varistor performance, which is attributed to the diffusion of the material of the substrate, can be effectively prevented. Further, another advantageous effect is also provided wherein a varistor voltage can be substantially reduced in the double-varistor structure, and an electrostatic capacitance thereof can be increased. The second electrode 70 embedded in the interior of the voltage-dependent resistive layer 50 is not necessarily a singular one, but may be a plural. One example of the plurality of second electrodes 70 embedded in the interior of the voltage-dependent resistive layer 50 can correspond to the above described embodiment "built-in multilayer varistor".

(Heterogeneous Ceramic Substrate)

FIG. 10 illustrates the LED package 150 according to the embodiment "heterogeneous ceramic substrate". In this embodiment, the body of the substrate is made of a plurality of material layers which differ from each other. In FIG. 10, the LED package has a two-layered structure composed of an upper layer 10A and a lower layer 10B. The upper layer 10A, in which the voltage-dependent resistive layer 50 is disposed, is made of a low-temperature sintered material (e.g., a glass ceramic), whereas the lower layer 10B is made of a high-temperature sintered material (e.g., an alumina or an aluminum nitride). In this case, the low-temperature sintered material layer as the upper layer 10A can be obtained by a low-temperature sintered process (for example, about 900° C. process), and is preferable in terms of the embedding of the voltage-dependent resistive layer 50 (i.e., varistor) into the substrate. On the other hand, the high-temperature sintered material layer as the lower layer can exhibit a higher conductivity and thus it can provide the substrate with excellent heat-releasing performance (heat conductivity of glass ceramic substrate layer: 3 to 5 W/mK, heat conductivity of alumina substrate layer: 10 to 20 W/mK, and heat conductivity of aluminum nitride substrate layer: 100 to 230 W/mK). The heterogeneous substrate illustrated in FIG. 10 (e.g., heterogeneous substrate composed of the glass ceramic substrate layer as the upper layer and the alumina substrate layer as the lower layer) can be obtained through an embedding process of a sintered varistor body into a multilayered structure composed of a "green sheet for a substrate of the low-temperature co-fired ceramic (LTCC)" provide on the fired alumina substrate (i.e., the alumina substrate obtained by the sintering process). In FIG. 10, the second electrode 70 is in an embedded state in the voltage-dependent resistive layer 50, and the Ni thin layer 105 and the Au thin layer 106 are positioned on the surface of the first electrode 60 (see FIG. 10(b)).

[Manufacturing Method of Substrate for Light-Emitting Element According to the Present Invention]

Next, a method for manufacturing the substrate for light-emitting element according to the present invention will be described. FIGS. 11(a) through 11(f) illustrate a process for carrying out the manufacturing method of the present invention.

The manufacturing method described below is based on "method for manufacturing a substrate for light-emitting element, the substrate being equipped with a varistor element comprising a voltage-dependent resistive layer and first and second electrodes electrically connected to the voltage-dependent resistive layer". Firstly, as illustrated in FIG. 11(a), a second electrode precursor layer 70' is formed on one main surface of a green sheet(s) 10' for the substrate. For example, the second electrode precursor layer 70' can be obtained by applying a Ag electrode paste on the green sheet, followed by drying thereof. Subsequent to the formation of the second electrode precursor layer 70', the second electrode precursor layer 70' is pressed into the green sheet by using a convex-shaped die 42, as illustrated in FIG. 11(b). The pressing can form a recessed portion 15 in the green sheet 10' while disposing the second electrode precursor layer 70' on a bottom surface of the recessed portion 15. Subsequently, as illustrated in FIG. 11(c), a carrier film 47 with the voltage-dependent resistive layer 50 carried thereon is used. By using such carrier film 47, the voltage-dependent resistive layer 50 can be disposed in the recessed portion 15 of the green sheet 10'. More specifically, the voltage-dependent resistive layer 50 is disposed on the second electrode precursor layer 70' in the recess portion 15 such that the resistive layer 50 is stacked on the electrode precursor layer 70'. Thereafter, the green sheet 10' with the second electrode precursor layer 70' and the voltage-dependent resistive layer 50 disposed in the recessed portion thereof is subjected to a sintering process. As a result, as illustrated in FIG. 11(d), the substrate 10 with the voltage-dependent resistive layer 50 and the second electrode 70 embedded therein is obtained (in this regard, the second electrode 70 is formed from the second electrode precursor layer 70' by the sintering process). It is preferred that the sintering process is performed by making use of "method of reducing a shrinkage phenomenon upon the sintering" as discussed in JP-A-04-243978 and JP-A-05-102666. According to the reducing method of the shrinkage phenomenon, there can be obtained the substrate 10 in which the voltage-dependent resistive layer 50 and the second electrode 70 are accurately embedded therein. Specifically, the reducing method of the shrinkage phenomenon can especially suppress the shrinkage in a planer direction, in which case the shrinkage occurs only in a thickness direction. For example, the shrinkage occurs by about 15% in an X-Y-Z direction in the conventional sintering method of the green sheet. While on the other hand, the reducing method of the shrinkage phenomenon allows the degree of shrinkage in the planar direction (i.e., X-Y) to be almost 0% (i.e., about 0.05%) wherein the shrinkage occurs by the degree of about 40% only in the thickness direction (Z). The manufacturing method of the present invention is characterized in that the voltage-dependent resistive layer which has been already sintered can be used. If a case where the "green sheet with the voltage-dependent resistive layer which has been already sintered therein" is subjected to the sintering process by the conventional sintering method is assumed, there is concern that warping and/or cracks of the resulting substrate may occur because of a shrinkage gap between "region of the voltage-dependent resistive layer, which does not undergo the sintering" and "region other than the voltage-dependent resistive layer, which undergoes the sintering". In view of the above, when the "method of reducing a shrinkage phenomenon upon the sintering" is employed in the present invention, the advantageous effect is provided wherein the warping and/or the cracks of the substrate would not occur due to no shrinkage in the planar direction.

Subsequent to the sintering process, the metal layer 90 is formed on the main surface of the substrate 10 as illustrated in FIG. 11(e). Thereafter, as illustrated in FIG. 11(f), the metal layer 90 is subjected to a patterning process to form the first electrode 60 in contact with the voltage-dependent resistive layer 50. As a result, there can be finally obtained the substrate for light-emitting element 100.

Just for a confirmation, "shrinkage-free sintering method", which can be suitably employed in the sintering of the green sheet, will be described. By the shrinkage-free sintering method, there can be obtained a substrate in which the shrinkage in the planar direction is particularly reduced. Therefore, when the shrinkage-free sintering method is applied to the step (D) of the manufacturing method of the present invention, the substrate 10 with the voltage-dependent resistive layer 50 and the second electrode 70 relatively accurately embedded therein can be suitably obtained. For example, the shrinkage-free sintering method disclosed in JP-A-05-102666 is summarized as follows:

The green sheet is formed by using a low temperature-sintering glass ceramic material (i.e., material for substrate) with at least an organic binder and a plasticizer included therein. Thereafter, an electrode pattern is formed on the green sheet by using a conductive paste composition. The green sheet with no electrode pattern and the green sheet with the electrode pattern are laminated on each other. Then, a green sheet consisting of an inorganic composition which cannot be sintered at a sintering temperature of the low temperature-sintering glass ceramic material is provided on the opposed sides or one side of the lamination body (i.e., the laminated sheets made of the low temperature-sintering glass ceramic material). Subsequently, the lamination body with the green sheet consisting of the inorganic composition disposed thereon is subjected to a sintering process. After the sintering, the sheet consisting of the inorganic composition, which has not been sintered, is removed. As a result, there can be obtained the glass ceramic substrate with no shrinkage (i.e., no shrinkage generated upon the sintering) in the planar direction.

In a case of producing the light-emitting device such as a LED package product by using the substrate for light-emitting element 100 of the present invention, the light-emitting element (e.g., a LED chip) is mounted such that it is electrically connected to the wiring pattern on the substrate surface, the wiring pattern being provided by the patterning of the metal layer 90. Preferably, the mounting of the LED chip is performed by a GGI technology. The GGI (Gold-to-Gold Interconnection) technology corresponds to a flip-chip mounting process in which a gold bump provided on a gold pad of the LED chip is connected to a gold pad provided on the substrate by a thermo-compression bonding. The GGI technology provides an advantageous effect in that no reflow and no flux cleaning is performed due to no use of solder bump, and also a satisfactory reliability can be obtained even at high temperature. In the GGI technology, a gold melting may be performed for example by using an ultrasonic wave in addition to the load and heat. After the mounting of the LED chip is completed, the necessary components (e.g., phosphor layer) are formed, followed by the encapsulating of the light-emitting element, the phosphor layer, the wirings and the like with an sealing resin. As a result, there can be obtained the light-emitting device as illustrated in FIG. 2.

In the manufacturing method of the present invention, the sintered voltage-dependent resistive layer can be used. More specifically, a voltage-dependent resistive layer which has been preliminarily subjected to the sintering process can be used as the voltage-dependent resistive layer 50 to be carried by the carrier film 47. Therefore, the voltage-dependent resistive layer 50 is not adversely affected by the subsequent sintering of the green sheet (specifically, the voltage-dependent resistive layer 50 is not chemically adversely influenced from the green sheet 10' upon the sintering thereof), and thereby a high performance of the varistor element can be still provided. Typical examples of the material for the voltage-dependent resistive layer include a zinc oxide type varistor material. The zinc oxide type varistor material can be obtained by adding bismuth oxide, antimony oxide, cobalt oxide and/or manganese oxide by about 0.5 mol % to about 1.0 mol % to the zinc oxide as a main composition, followed by the sintering thereof. In this case, a typical sintering temperature is in the range of about 1200° C. to about 1350° C. While on the other hand, the low-temperature co-fired glass ceramic substrate (LTCC) is obtained by the sintering at a temperature of about 900° C. In the light of this, it can be understood that the manufacturing method of the present invention (wherein the sintered voltage-dependent resistive layer is used and the sintering process of the green sheet for forming the LTCC is performed at about 900° C.) allows the voltage-dependent resistive layer to be hardly influenced by the LTCC sintering, making it possible to keep the high varistor performance. The term "high varistor performance" as used herein specifically means that "clamping voltage characteristic is excellent" and "less electric current is leaked to the varistor upon the driving of the LED". Incidentally, the phrase "clamping voltage characteristic is excellent" specifically means that the voltage-dependent resistive layer is stable with respect to the voltage to be continuously applied and the fluctuation thereof, and that a possible surge voltage can be reduced to a level equal to or less than a withstand voltage of the LED.

With respect to the carrier film 47 with the voltage-dependent resistive layer 50 disposed thereon, the manufacturing process thereof is illustrated in FIGS. 12(*a*) through 12(*d*). Firstly, a green sheet 50' capable of forming the voltage-dependent resistive layer is prepared (see FIG. 12(*a*)). Next, the green sheet 50' is subjected to a sintering process to form the voltage-dependent resistive layer 50 therefrom (see FIG. 12(*b*)). Subsequently, as illustrated in FIG. 12(*c*), the voltage-dependent resistive layer 50 and the carrier sheet 47 are laminated on each other. As a result, there can be obtained the carrier film 47 with the voltage-dependent resistive layer 50 disposed thereon. In a case where a plurality of voltage-dependent resistive layers 50 embedded in the substrate are manufactured, the voltage-dependent resistive layers 50 may be processed to have a form illustrated in FIG. 12(*d*). Alternatively, another process may be possible wherein a plurality of green sheets 50' capable of forming the voltage-dependent resistive layer are prepared by press-cutting the lamination of the green sheets having a desired thickness into pieces of a desired size by means of a thin cutter, and the resulting plurality of green sheets 50' (i.e., unsintered precursor layers of the voltage-dependent resistive layers) are sintered, and thereafter the resulting voltage-dependent resistive layers are disposed on the carrier film.

Various modified embodiments may be possible with respect to the manufacturing method of the present invention. The detailed explanation about this will be described.

(Direct Pressing 1)

Figure 13:
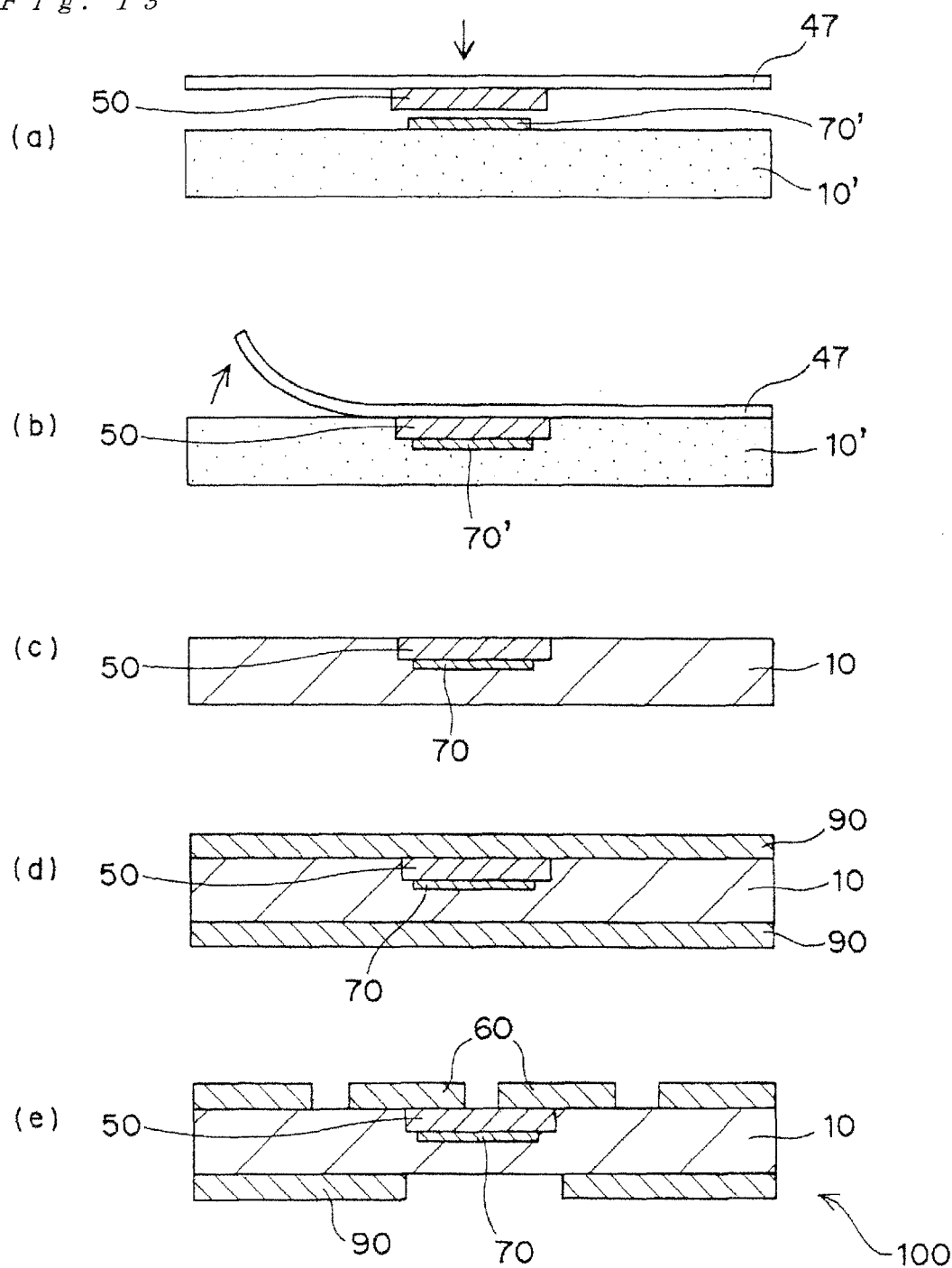
FIG. 13 includes cross-sectional views showing the steps in a manufacturing process with respect to an embodiment "Direct pressing 1".

FIGS. 13(*a*) through 13(*e*) schematically illustrate the manufacturing process of the present invention according to an embodiment "direct pressing 1". In this embodiment, a second electrode precursor layer 70' is formed on a main surface of the green sheet 10'. After that, as illustrated in FIG. 13(*a*), the voltage-dependent resistive layer 50 disposed on the carrier film 47 is pressed into the green sheet via the second electrode precursor layer 70'. This makes it possible to form a recessed portion in the green sheet while disposing the voltage-dependent resistive layer and the second electrode precursor layer 70' in the recessed portion thus formed, as illustrated in FIG. 13(*b*). In other words, the voltage-dependent resistive layer 50 and the second electrode precursor layer 70' are forced to be embedded into the green sheet 10' by an application of an external force thereto. The subsequent processes performed after the embedding of the resistive layer 50 and the precursor layer 70' are similar to the above described manufacturing method wherein the sintering of the green sheet 10' is performed to produce the substrate 10 with the voltage-dependent resistive layer 50 and the second electrode 70 embedded therein (see FIG. 13(*c*)), and then the metal layer 90 is formed (see FIG. 13(*d*)), and the formed metal layer 90 is subjected to a patterning process to form the first electrode 60 in contact with the voltage-dependent resistive layer 50 (see FIG. 13 (*e*)).

(Direct Pressing 2)

Figure 14:
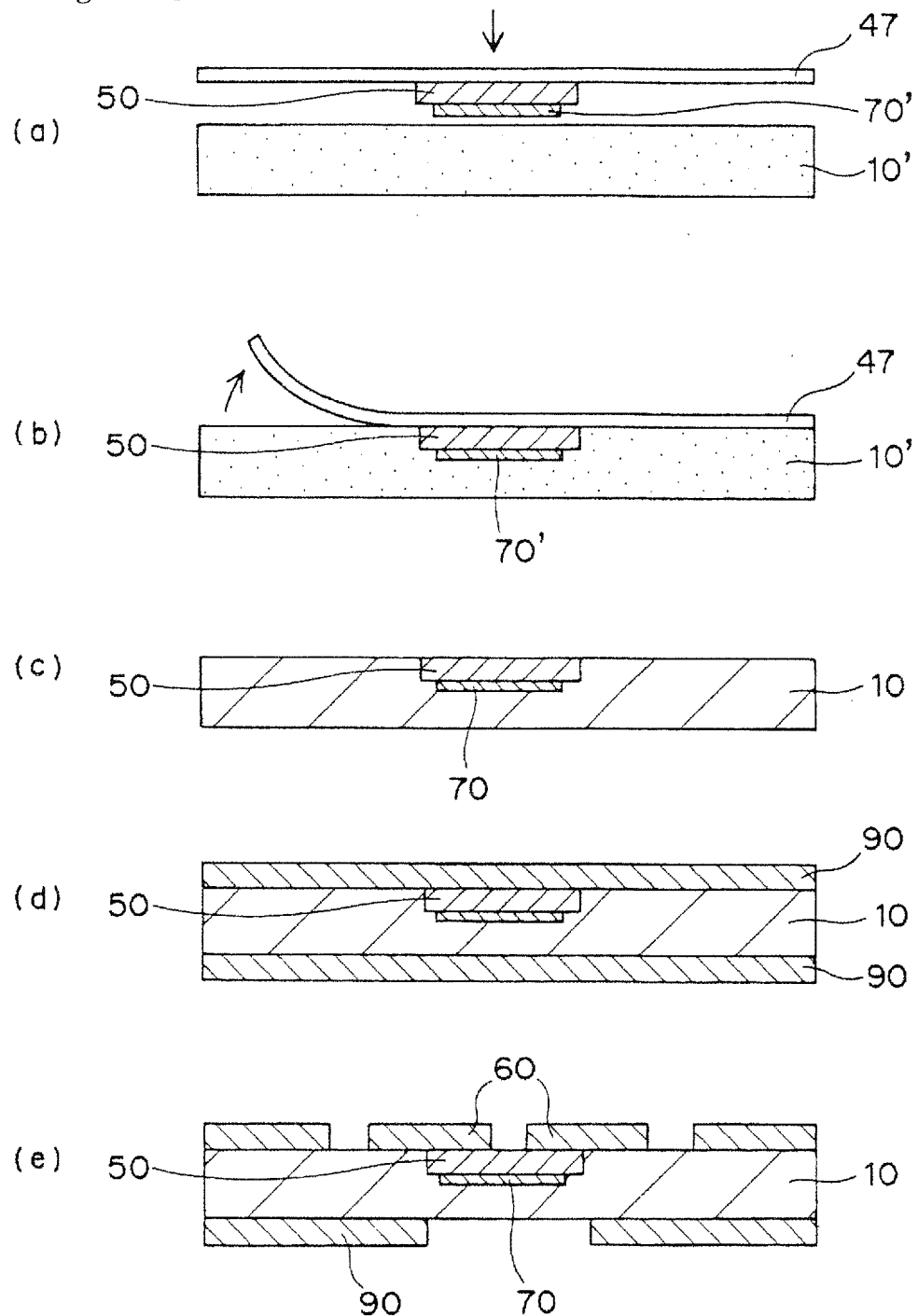
FIG. 14 includes cross-sectional views showing the steps in a manufacturing process with respect to an embodiment "Direct pressing 2".
Figure 15:
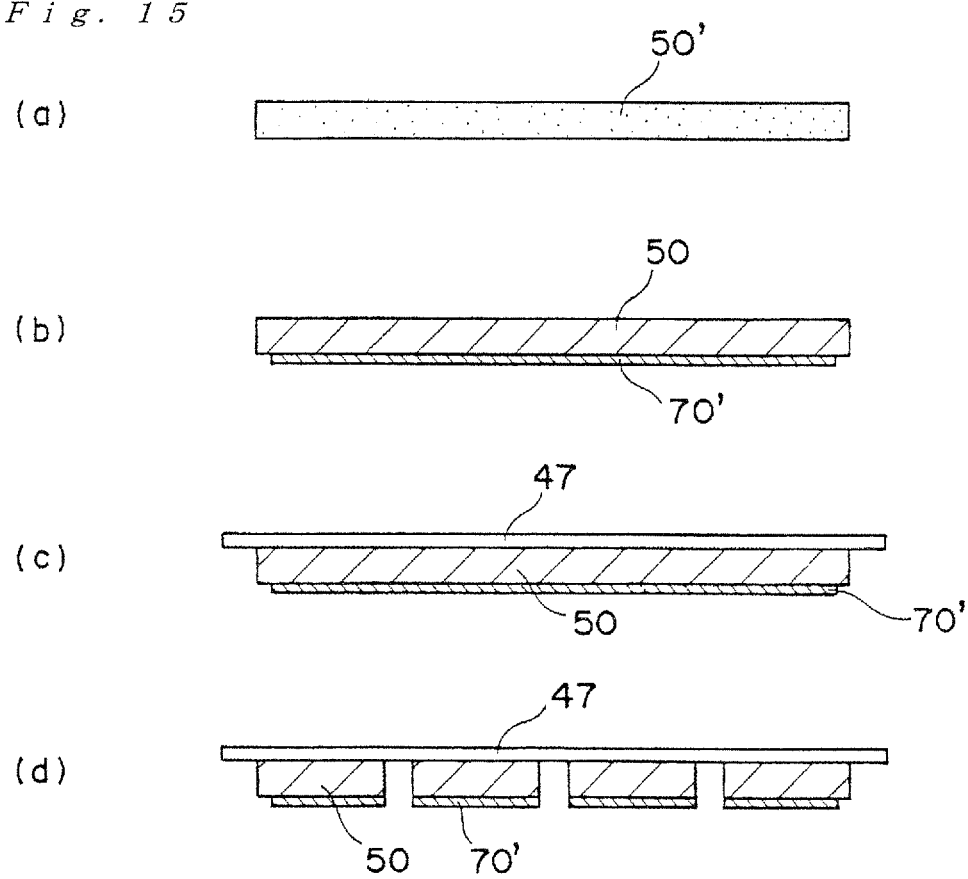
FIG. 15 includes cross-sectional views showing the steps in a manufacturing process of a carrier film with the voltage-dependent resistive layers and the second electrode precursor layers provided thereon.

FIGS. 14(*a*) through 14(*e*) schematically illustrate the manufacturing process of the present invention according to an embodiment "direct pressing 2". In this embodiment, the carrier film 47 with the voltage-dependent resistive layer 50 and the second electrode precursor layer 70' disposed thereon is used, as illustrated in FIG. 14(*a*). With respect to manufacturing process of such carrier film with the resistive layer and the precursor layer formed thereon, see FIGS. 15(*a*) through 15(*d*). The carrier film 47 with the voltage-dependent resistive layer 50 and the second electrode precursor layer 70' thereon is pressed into the green sheet under such a condition that the second electrode precursor layer 70' is positioned at a lower side. This pressing makes it possible to form a recessed portion in the green sheet while disposing the voltage-dependent resistive layer 50 and the second electrode precursor layer 70' in the recessed portion, as illustrated in FIG. 14(*b*). In other words, the voltage-dependent resistive layer 50 and the second electrode precursor layer 70' are forced to be embedded into the green sheet 10' by an application of an external force thereto. The subsequent processes performed after the embedding of the resistive layer 50 and the precursor layer 70' are similar to the above described manufacturing method wherein the sintering of the green sheet 10' is performed to produce the substrate 10 with the voltage-dependent resistive layer 50 and the second electrode 70 embedded therein (see FIG. 14(*c*)), and then the metal layer 90 is formed (see FIG. 14(*d*)), and the formed metal layer 90 is subjected to a patterning process to form the first electrode 60 in contact with the voltage-dependent resistive layer 50 (see FIG. 14 (*e*)).

(Disposition in Recessed-Portion)

Figure 16:
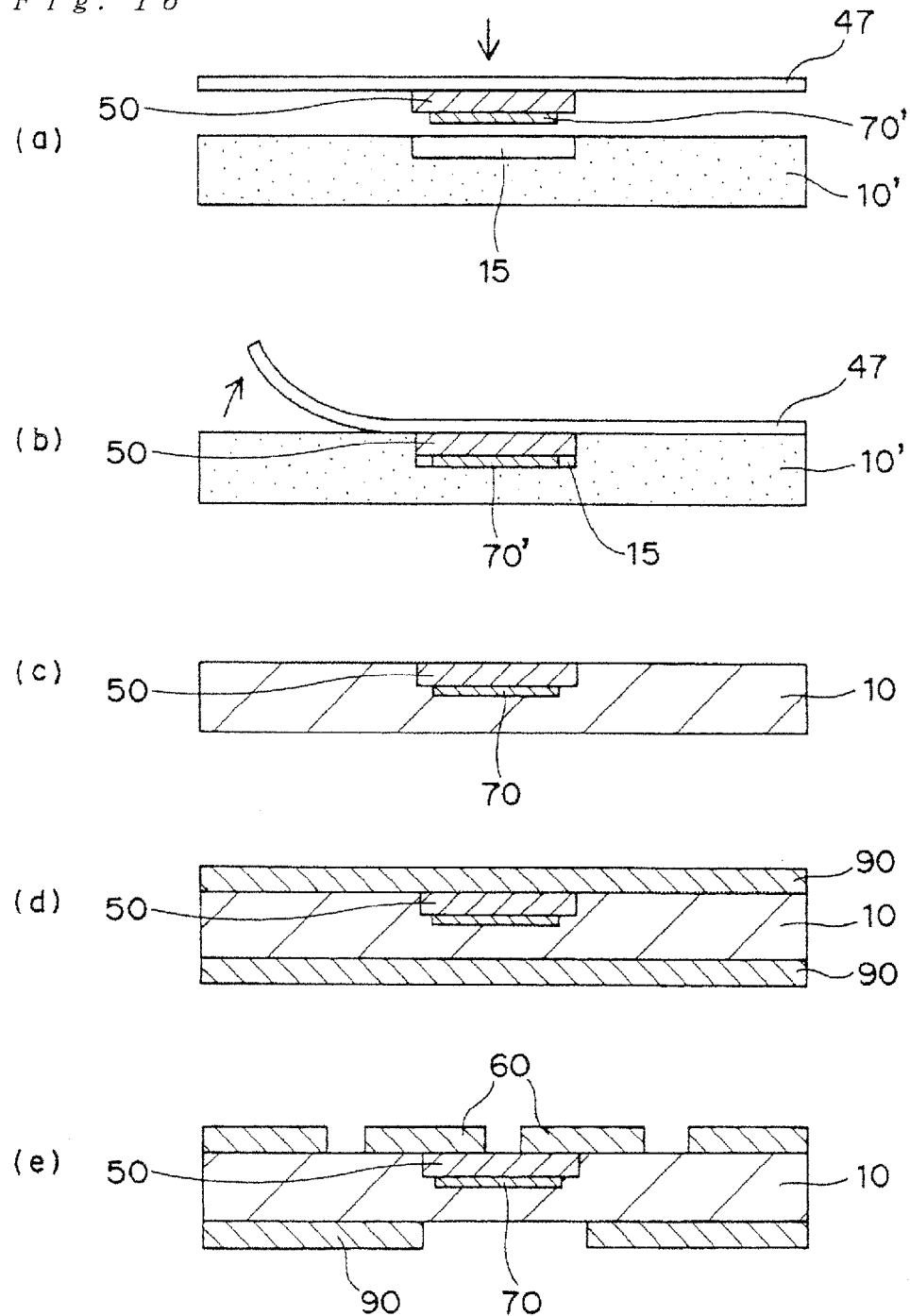
FIG. 16 includes cross-sectional views showing the steps in a manufacturing process with respect to an embodiment "Disposition in recessed-portion".

FIGS. 16(*a*) through 16(*e*) schematically illustrate the manufacturing process of the present invention according to an embodiment "disposition in recessed-portion". As illustrated in FIG. 16(*a*), this embodiment is characterized by the use of the green sheet 10' having the recessed portion 15 in advance. The green sheet 10' with the recessed portion 15 beforehand provided therein can be produced by pressing a convex-shaped die into the green sheet 10' through the main surface thereof. Subsequent to the formation of the recessed portion in the green sheet, the voltage-dependent resistive layer 50 and the second electrode precursor layer 70' provided on the carrier film 47 are disposed in the recessed portion 15 of the green sheet 10', as illustrated in FIG. 16(*b*). The subsequent processes performed after the disposition of the resistive layer 50 and the precursor layer 70' are similar to the above described manufacturing method wherein the sintering of the green sheet 10' is performed to produce the substrate 10 with the voltage-dependent resistive layer 50 and the second electrode 70 embedded therein (see FIG. 16(*c*)), and then the metal layer 90 is formed (see FIG. 16(*d*)), and the formed metal layer 90 is subjected to a patterning process to form the first electrode 60 in contact with the voltage-dependent resistive layer 50 (see FIG. 16 (*e*)).

(Sintered Substrate with Recessed-Portion)

Figure 17:
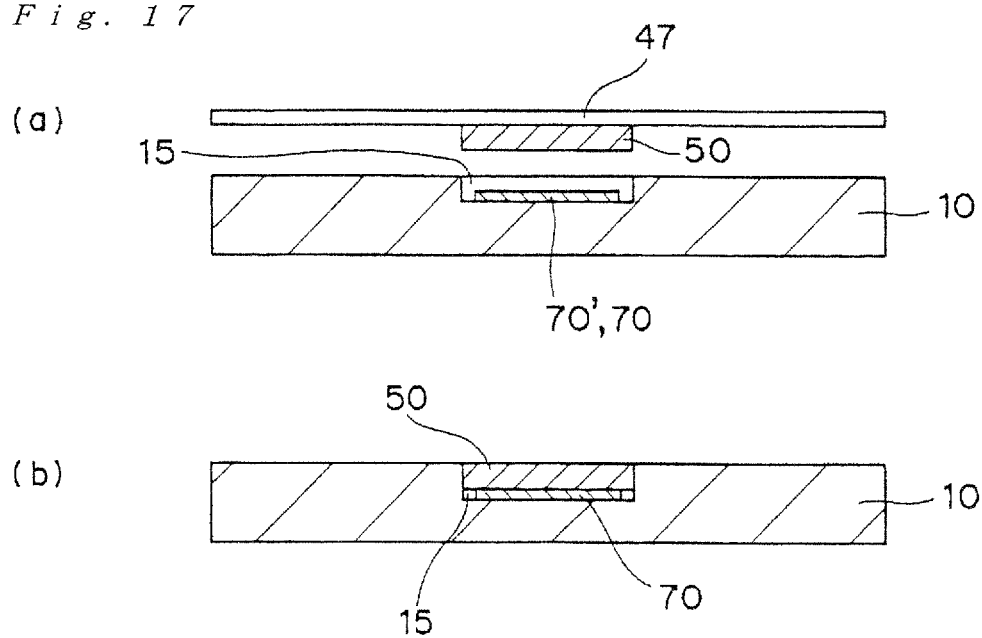
FIG. 17 includes cross-sectional views showing the steps in a manufacturing process with respect to an embodiment "Sintered substrate with recessed-portion".

FIGS. 17(*a*) and 17(*b*) schematically illustrate the manufacturing process of the present invention according to an embodiment "sintered substrate with recessed-portion". This embodiment is characterized by the use of the sintered substrate having the recessed portion in advance. The use of this substrate 10 can produce the light-emitting element substrate of the present invention only by disposing the second electrode precursor layer 70' and the voltage-dependent resistive layer 50 in the recessed portion 15, followed by a heating treatment of precursor layer to form the second electrode, as illustrated in FIGS. 17(*a*) and 17(*b*). Instead of the second electrode precursor layer 70', the preliminarily sintered second electrode 70 may be disposed in the recessed portion 15 of the sintered substrate, which also makes it possible to produce the light-emitting element substrate of the present invention. In this case, the voltage-dependent resistive layer 50 disposed in the recessed portion is not thermally affected, and thereby a high varistor characteristic can be suitably kept. With respect to this embodiment, a glass sealing process may be performed, as required.

(Use of Electrode-Accommodated Resistive Layer)

The manufacturing process as illustrated in FIGS. 11 through 17 can be applied to a case of the manufacturing process of the substrate for light-emitting element, the substrate being equipped with "voltage-dependent resistive layer having the second electrode accommodated therein" (e.g., the multilayer varistor). For example, the substrate equipped with the voltage-dependent resistive layer 50 having the second electrode 70 accommodated therein can be produced as illustrated in FIGS. 18(a) and 18(b). Namely, the "voltage-dependent resistive layer 50 having the second electrode 70 accommodated therein" is disposed on a main surface of the green sheet 10', and thereafter the convex-shaped die 42 is used to press the "voltage-dependent resistive layer 50 having the second electrode 70 accommodated therein" into the green sheet. Such pressing can form the recessed portion in the green sheet 10', while disposing the "voltage-dependent resistive layer 50 having the second electrode 70 accommodated therein" on a bottom surface of the recessed portion. The subsequent processes performed after the disposition of the "voltage-dependent resistive layer 50 having the second electrode 70 accommodated therein" are similar to the above described manufacturing method wherein the sintering of the green sheet is performed to produce the substrate 10 with the voltage-dependent resistive layer and the second electrode embedded therein, and then the metal layer is formed, and the formed metal layer is subjected to a patterning process to form the first electrode in contact with the voltage-dependent resistive layer. In this embodiment, a performance test of the protection element (i.e., performance test of the varistor) can be carried out prior to the embedding step, which leads to an improved yield in the manufacturing process of the substrate. Further, this embodiment can make use of the varistor obtained individually by the preliminary sintering, and thereby a high varistor performance may be kept after the production of the light-emitting element substrate. The "varistor" tends to exhibit a desired varistor characteristic when the sintering process for forming the varistor element is performed at a higher temperature than a sintering temperature of the green sheet. Therefore, "unsatisfactory sintering (i.e., insufficient firing) of the varistor formation" can be avoided by a case where the sintering of the green sheet is performed with the already-sintered varistor obtained by the sintering at a desired temperature, not the case where the varistor is produced upon the sintering of the green sheet. As a result thereof, there can be finally obtained the light-emitting element substrate with a desired varistor performance.

Although some embodiments of the present invention have been hereinbefore described, they are merely the typical embodiments. It will be readily appreciated by those skilled in the art that the present invention is not limited to the above embodiments, and that various modifications are possible without departing from the scope of the present invention.

For example, although the manufacturing method of the present invention has been described based on the voltage-dependent resistive layer disposed in the substrate being singular, the present invention is not necessarily limited to that. For example, "substrate in which a plurality of voltage-dependent resistive layers embedded in a form of array", i.e., "substrate in which a plurality of light-emitting elements to be mounted in a form of array" is possible, and even in this case, such substrate can be manufactured by a process similar to the above described manufacturing process.

In this regard, the above substrate can be manufactured by a process illustrated in FIGS. 19(a) through 19(f). FIG. 19 shows an example of a method for forming a copper wiring on the LTCC by a semi-additive process. FIG. 19(a) illustrates a state that the plurality of voltage-dependent resistive layers are in an embedded state such that they are flush with the surface of the substrate. The whole of the substrate as illustrated in FIG. 19(a) is dipped into a Pd catalyst solution, followed by drying thereof. The dried substrate is subjected to an electroless nickel plating process (see FIG. 19(b)). As a result, a thin metal plated layer (i.e., nickel metal layer) is formed on the whole of the substrate. Alternatively, the metal layer may be formed on the substrate by a sputtering process with the use of a copper metal, a nickel metal, or an alloy of nickel metal and chrome. Subsequent to the formation of the metal layer, the photo-resists are formed by a photolithography process. Specifically, the photo-resists are formed on the nickel metal layer at limited positions where the subsequent electro-copper plating is not intended to be provided, as illustrated in FIG. 19(c). The photo-resists can be formed by applying the resist material on the entire surface of the substrate, followed by a mask pattern exposure process and a subsequent development process. It is preferred that the photo-resists have their thickness of 60 μm or more which corresponds to a desired thickness of the copper electrode. Subsequent to the formation of the photo-resists, a thick copper layer is formed by an electro-copper plating process wherein the preliminarily formed nickel layer is used as a common electrode, as illustrated in FIG. 19(d). Then, the resists are removed as illustrate in FIG. 19(e), and finally a soft etching process is performed on the entire surface of the substrate in FIG. 19(f), thereby removing the copper surface portion and a nickel layer beneath thereof to finish the manufacturing of the substrate. According to this process, the thick copper electrode can be formed and a fine gap between electrodes can be provided. In light of the flip-chip mounting of the LED element, a distance between electrodes is desired to be 60 μm or less considering a downsizing of the element. In this case, the electrode is required to have a thickness of 60 μm or more in view of the suitable heat releasing. Therefore, the process illustrated in FIG. 19 is important in realizing the desired dimension of the electrode (i.e., 60 μm or more) and the required distance between the electrodes (i.e., 60 μm or less).

Further, the substrate of the present invention can be manufactured by another process as illustrated in FIGS. 20(a) through 20(h). The process can reduce an adverse effect on the voltage-dependent resistive layer. That is, the process is a mild process with respect to the voltage-dependent resistive layer. FIG. 20(a) illustrates a substrate wherein the voltage-dependent resistive layer 50 is in an embedded state in flush with the substrate. Ti thin film 101 (e.g., Ti layer having a film thickness of about 60 nm) is formed on the substrate 10 by a sputtering process, and thereafter Cu thin film 102 (e.g., Cu layer having a film thickness of about 300 nm) is formed on the Ti thin film in a similar manner by a sputtering process (see FIG. 20(b)). The Ti thin film 101 (i.e., base layer) can serve as a bonding strength maintaining layer and a protective layer (i.e., protection from an etchant and a plating solution) in the ceramic substrate 10. While on the other hand, the Cu thin film 102 can serve as a common electrode with low resistance in the subsequent treatment of the electro-copper plating. After the formation of the Ti thin film and the Cu thin film, the photo-resists 103 are formed at limited positions where the subsequent electro-copper plating is not intended to be provided (see FIG. 20(c)). The photo-resists can be formed by applying the resist material on the entire surface of the substrate, followed by a mask pattern exposure process and a subsequent development process. Subsequent to the formation of the photo-resists, a thick copper layer 104 is formed by an electro-copper plating process wherein the preliminarily formed Cu thin film 102 is used as a common electrode, as illustrated in FIG. 20(d). Subsequent to the electro-copper plating process, an electrolytic nickel plating process and an electrolytic gold plating are performed to form Ni plating layer 105 and Au plating layer 106 as illustrated in FIG. 20(e). The Ni layer 105 and the Au layer 106 can be formed by the electrolytic plating treatment, and thus they can be provided at low cost. Subsequently, the photo-resists 103 are removed as illustrated in FIG. 20(f). Then, by making use of the Ni layer 105 and the Au layer 106 as resist parts, the Ti thin film 101 and the Cu thin film 102 (which are ones formed by sputtering) are partially etched away by an etching process (see FIGS. 20(g) and 20(h)) to finish the manufacturing of the substrate. According to this process, the voltage depended resistive layer 50 does not make contact with an alkali solution and/or an acid solution until the last process of partially etching the Ti thin film 101. The voltage-dependent resistive layer (i.e., varistor) is generally sensitive to the acid and/or alkali. In this regard, the present process partially removes the Ti thin film by using the etching solution with its pH being 7, which can reduce an adverse effect on the voltage-dependent resistive layer, and thus a mild treatment therefor is provided.

Furthermore, the above described process can also be applied to a manufacturing of the substrate with the built-in multilayer varistor (i.e., substrate with the chip varistor embedded therein). The process for the substrate with the chip varistor embedded therein is illustrated in FIGS. 21(a) through 21(h). FIG. 21(a) illustrates a substrate wherein the chip varistor product is in an embedded state in flush with the substrate. Firstly, Ti thin film 101 (e.g., Ti layer having a film thickness of about 60 nm) is formed on the substrate 10 with the chip varistor embedded therein by a sputtering process, and thereafter Cu thin film 102 (e.g., Cu layer having a film thickness of about 300 nm) is formed on the Ti thin film in a similar manner by a sputtering process (see FIG. 21(b)). The Ti thin film 101 (i.e., base layer) can serve as a bonding strength maintaining layer and a protective layer (i.e., protection from an etchant and a plating solution) in the ceramic substrate 10. While on the other hand, the Cu thin film 102 can serve as a common electrode with low resistance in the subsequent treatment of the electro-copper plating. After the formation of the Ti thin film and the Cu thin film, the photo-resists 103 are formed at limited positions where the subsequent electro-copper plating is not intended to be provided (see FIG. 21(c)). The photo-resists can be formed by applying the resist material on the entire surface of the substrate, followed by a mask pattern exposure process and a subsequent development process. Subsequent to the formation of the photo-resists, a thick copper layer 104 is formed by an electro-copper plating process wherein the preliminarily formed Cu thin film 102 is used as a common electrode, as illustrated in FIG. 21(d). Subsequent to the electro-copper plating process, an electrolytic nickel plating process and an electrolytic gold plating are performed to form Ni plating layer 105 and Au plating layer 106 as illustrated in FIG. 21(e). The Ni layer 105 and the Au layer 106 can be formed by the electrolytic plating treatment, and thus they can be provided at low cost. Subsequently, the photo-resists 103 are removed as illustrated in FIG. 21(f). Then, by making use of the Ni layer 105 and the Au layer 106 as resist parts, the Ti thin film 101 and the Cu thin film 102 (which are ones formed by sputtering) are partially etched away by an etching process (see FIGS. 21(g) and 21(h)) to finish the manufacturing of the substrate. According to this process, the chip varistor does not make contact with an alkali solution and/or an acid solution until the last process of partially etching the Ti thin film 101. The chip varistor is generally sensitive to the acid and/or alkali. In this regard, the present process partially removes the Ti thin film by using the etching solution with its pH being 7, which can reduce an adverse effect on the chip varistor, and thus a mild treatment therefor is provided.

Figure 22:
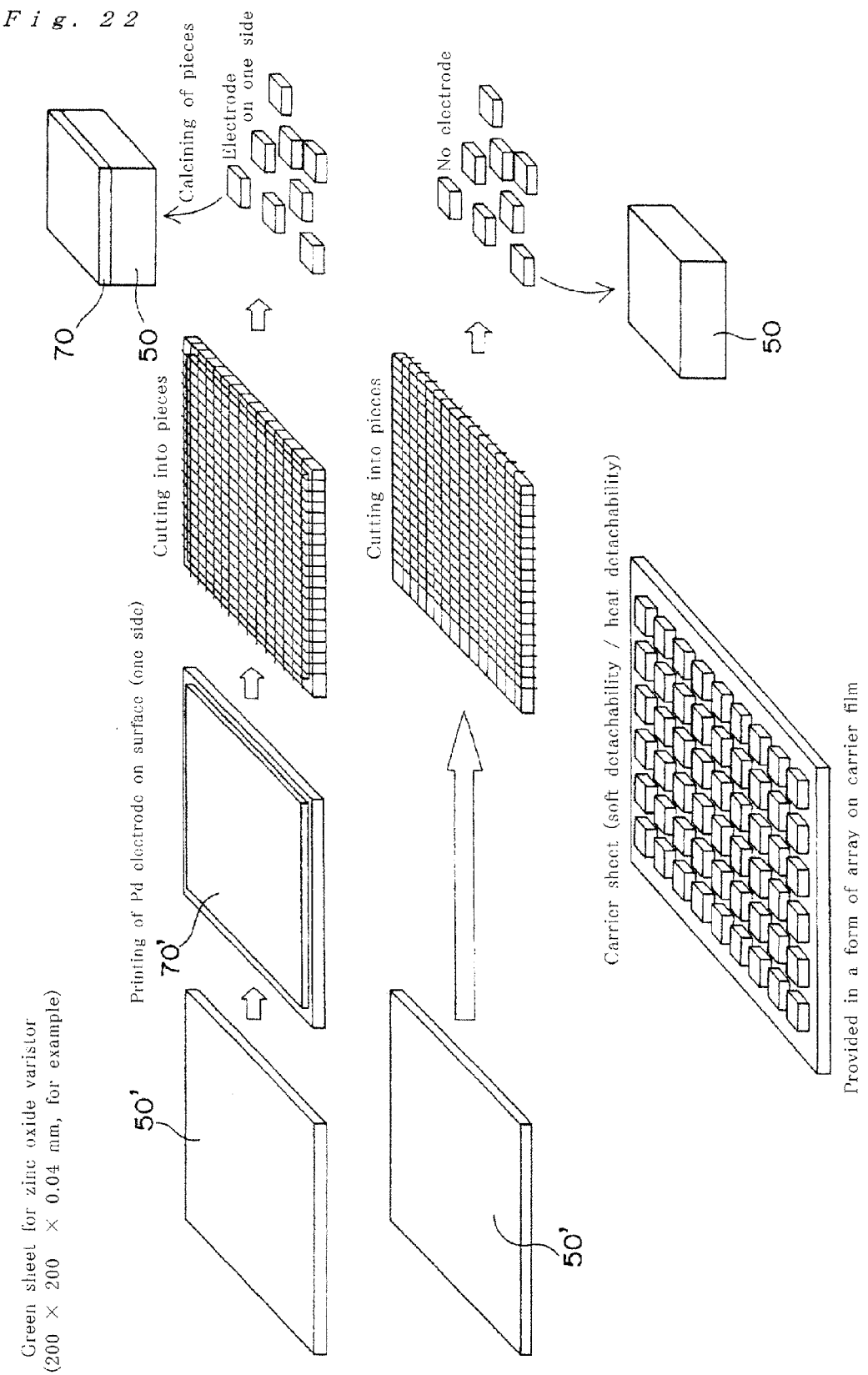
FIG. 22 schematically illustrates a process with respect to the preparing of a plurality of green sheets 10'.

Although the embodiment of the present invention has been hereinbefore described wherein the voltage-dependent resistive layer disposed in the carrier film is in a form of singular layer, the present invention is not limited to that. For example, an embodiment as illustrated in FIG. 22 may be possible. More detailed explanation about this is as follows: a plurality of green sheets for varistor (especially "green sheets for zinc oxide varistor") are stacked on each other to form the stacked body with the desired thickness. The stacked body composed of the green sheets is cut into small pieces (for example, a razor-like cutter is pressed against the stacked body to cut it into pieces to obtain the desired number of the pieces which are to be arranged on the carrier film). Then, for example, about 100000 pieces of the divided green sheet body are sintered in a batch. Subsequently, the sintered pieces are disposed on the carrier film in a form of array. Alternatively, another process may be possible wherein an printing of an electrode precursor is performed after the formation of the stacked body, followed by the cutting and the sintering thereof. Still another process may also be possible wherein the pieces of the divided green sheet body with no printing of the electrode precursor are sintered, and thereafter the sintered pieces are disposed in a form of array, followed by the printing of the electrode precursor and the heating treatment thereof.

Although the embodiment of the present invention has been hereinbefore described wherein the voltage-dependent resistive layer, which is in an embedded state within the substrate, is positioned beneath the light-emitting element to be mounted, the present invention is not limited to that. For example, as illustrated in FIG. 23, the voltage-dependent resistive layer 50 may be in an embedded state such that at least the part of the layer 50 is in an overlapping relation with the mounting region for the light-emitting element 20. In this case, the thermal via can be provided immediately below the light-emitting element generating the heat, which leads to an improved heat-releasing performance of the substrate.

Although the embodiment of the present invention has been hereinbefore described wherein the substrate may have the two-layered structure composed of an upper layer and a lower layer with respect to the case of the heterogeneous ceramic substrate, the present invention is not limited to that. Specifically, the substrate of the present invention may be composed of more than two layers of different materials. For example, the substrate may be three-layered structure or four-layered structure, which also leads to an improved heat-releasing performance of the substrate.

Finally, by exemplifying the LED package as illustrated in FIG. 24, the characteristic of the present invention according to the LED package of FIG. 24 will be described below:

The complex configuration of the laminated type zinc oxide varistor is no longer required and a down-sizing and a cost reduction can be achieved since the connecting portions and the via holes can be omitted.

Since the sintered zinc oxide varistor can be used, and thereby a high performance of the varistor can be still hold.

Copper electrode is used not only for the electrode terminals of the LED, but also for the surface electrode of a zinc oxide varistor as it is. This leads to a relatively simple structure of the package with an improved heat-releasing performance.

The electrodes can be substantially shared for the use of the zinc oxide varistor and for the use of the LED package.

The zinc oxide varistor can be provided on either one of the top surface side and the undersurface side of the package substrate.

It should be noted that the present invention as described above includes the following aspects:

The First Aspect:

A substrate for light-emitting element, including a mounting surface on which a light-emitting element is to be mounted, the mounting surface being one of two opposed main surfaces (opposed principal surfaces) of the substrate:

wherein the substrate for light-emitting element is provided with a protection element for the light-emitting element, the protection element comprising a voltage-dependent resistive layer embedded in the substrate, and a first electrode and a second electrode each of which is in connection with the voltage-dependent resistive layer; and wherein the mounting of the light-emitting element is such that the light-emitting element is positioned in an overlapping relation with the voltage-dependent resistive layer.

The Second Aspect:

The substrate for light-emitting element according to the first aspect, wherein a surface of the voltage-dependent resistive layer lies in the same plane as the one of the two opposed main surfaces of the substrate (i.e., the mounting surface of the substrate), and thereby the surface of the voltage-dependent resistive layer forms a part of the mounting surface.

The Third Aspect:

The substrate for light-emitting element according to the first aspect, wherein a surface of the voltage-dependent resistive layer lies in the same plane as the other of the two opposed main surfaces of the substrate (i.e., the main surface of the substrate, which is opposed to the mounting surface thereof).

The Fourth Aspect:

The substrate for light-emitting element according to the second or third aspect, wherein the first electrode is positioned in contact with a substrate exposure surface of the voltage-dependent resistive layer; and wherein the second electrode is in contact with a substrate embedment surface of the voltage-dependent resistive layer or is accommodated in the interior of the voltage-dependent resistive layer in an opposed relation to the first electrode.

The Fifth Aspect:

The substrate for light-emitting element according to the fourth aspect, wherein the second electrode is positioned in contact with the substrate embedment surface of the voltage-dependent resistive layer; and wherein the second electrode is in connection with an electrode or metal layer provided on the one or the other of the two opposed main surfaces (i.e., the mounting surface and surface opposed thereto) by a via hole which extends in the body of the substrate between the voltage-dependent resistive layer and the one or the other of the two opposed main surfaces.

The Sixth Aspect:

The substrate for light-emitting element according to any one of the first to fifth aspects, wherein the protection element is a varistor element.

The Seventh Aspect:

The substrate for light-emitting element according to the sixth aspect, wherein the varistor element is a multilayer varistor element (or a chip varistor).

The Eighth Aspect:

The substrate for light-emitting element according to any one of the first to seventh aspects, wherein the first electrode has a divided form wherein the divided two pieces of the first electrode are positioned in contact with the substrate exposure surface of the voltage-dependent resistive layer.

The Ninth Aspect:

The substrate for light-emitting element according to the sixth aspect when appendant to the fourth or fifth aspect, wherein the first electrode has a divided form wherein the divided two pieces of the first electrode are positioned on the substrate exposure surface of the voltage-dependent resistive layer, whereas the second electrode is positioned such that it is in contact with the substrate embedment surface of the voltage-dependent resistive layer; and wherein the varistor element is composed of serially-connected two varistor elements which share the second electrode provided on the substrate embedment surface of the voltage-dependent resistive layer.

The Tenth Aspect:

The substrate for light-emitting element according to the eighth aspect, wherein a positive electrode of the light-emitting element is to be in connection with one of the divided two pieces of the first electrode, whereas a negative electrode of the light-emitting element is to be in connection with the other of the divided two pieces of the first electrode.

The Eleventh Aspect:

The substrate for light-emitting element according to any one of the first to tenth aspects, wherein the substrate has a two-layered structure composed of an upper layer and a lower layer made of different materials from each other, the upper layer providing the substrate with the mounting surface, and also having the voltage-dependent resistive layer embedded therein.

The Twelfth Aspect:

A light-emitting device comprising the substrate for light-emitting element according to any one of the first to eleventh aspects and a light-emitting element mounted on the mounting surface of the substrate.

The Thirteenth Aspect:

The light-emitting device according to the twelfth aspect, wherein the light-emitting element is a LED chip equipped with a positive electrode and a negative electrode on its surface which is opposed to a light-emitting surface of the LED chip; and wherein the LED chip is in a mounted state on the mounting surface of the substrate in a manner of flip-chip.

The Fourteenth Aspect:

A method for manufacturing a substrate for light-emitting element, the substrate including a varistor element comprising a voltage-dependent resistive layer and first and second electrodes each of which is in connection with the voltage-dependent resistive layer, the method comprising the steps of:

(A) forming a second electrode precursor layer on a main surface (i.e., mounting surface) of a green sheet(s);

(B) pressing the second electrode precursor layer into the green sheet from above by means of a convex-shaped die, and thereby forming a recessed portion in the green sheet with the second electrode precursor layer disposed on a bottom surface of the recessed portion;

(C) disposing the voltage-dependent resistive layer in the recessed portion (especially disposing the voltage-dependent resistive layer on the second electrode precursor layer positioned in the recessed portion);

(D) sintering the green sheet with the voltage-dependent resistive layer and the second electrode precursor layer disposed in the recessed portion thereof, and thereby obtaining a substrate with the voltage-dependent resistive layer and the second electrode embedded therein; and (E) forming a metal layer on the substrate and then subjecting the metal layer to a patterning process, and thereby forming the first electrode in contact with the voltage-dependent resistive layer.

The Fifteenth Aspect:

The method for manufacturing the substrate for light-emitting element according to the fourteenth aspect, wherein, instead of the steps (A) and (B), another step is performed wherein a recessed portion is formed in a main surface (i.e., mounting surface) of a green sheet(s) by means of a convex-shaped die by pushing the die into the green sheet; and wherein, in the step (C), the voltage-dependent resistive layer having a second electrode precursor layer formed on a lower surface thereof is disposed in the recessed portion of the green sheet.

The Sixteenth Aspect:

The method for manufacturing the substrate for light-emitting element according to the fourteenth aspect, wherein, instead of the steps (B) and (C), another step is performed wherein the voltage-dependent resistive layer is pressed into the green sheet via the second electrode precursor layer (more specifically, the voltage-dependent resistive layer is pressed into the green sheet under such a condition the voltage-dependent resistive layer is positioned on the second electrode precursor layer disposed on the green sheet), and thereby forming a recessed portion in the green sheet while disposing the voltage-dependent resistive layer and the second electrode precursor layer in the recessed portion.

The Seventeenth Aspect:

The method for manufacturing the substrate for light-emitting element according to the fourteenth aspect, wherein, instead of the steps (A) to (C), another step is performed wherein the voltage-dependent resistive layer having a second electrode precursor layer formed thereon is pressed into a green sheet(s) under such a condition that the second electrode precursor layer is positioned beneath the voltage-dependent resistive layer, and thereby forming a recessed portion in the green sheet while disposing the voltage-dependent resistive layer and the second electrode precursor layer in the recessed portion.

The Eighteenth Aspect:

The method for manufacturing the substrate for light-emitting element according to the fourteenth aspect, wherein, instead of the steps (A) to (C), another step is performed wherein the voltage-dependent resistive layer accommodating the second electrode in an interior thereof is disposed on a main surfaces of a green sheet(s), and then the voltage-dependent resistive layer is pressed into the green sheet from above by means of a convex-shaped die, and thereby forming a recessed portion in the green sheet with the voltage-dependent resistive layer accommodating the second electrode in the interior thereof disposed in a bottom surface of the recessed portion; and wherein, in the step (D), the green sheet is sintered to obtain the substrate with the voltage-dependent resistive layer and the second electrode embedded therein.

EXAMPLES

To confirm the effect of the present invention, some tests were carried out.
<Confirmation Test of Varistor Performance>

To confirm the performance of the voltage-dependent resistive layer embedded in the light-emitting element substrate, the substrate as illustrated in FIG. 8(c) was manufactured wherein a comparison was made as to a varistor performance before and after the embedding of the chip varistor in the ceramic substrate.

The chip varistor precursor with its size of 0.6 mm×0.3 mm×0.3 mm (length×width×thickness) was used. The chip varistor precursor had a double-layered structure of the internal electrode disposed therein. The internal electrode had a main component of Ag/Pd=80/20 mol %. The chip varistor precursor had a stacked body composed of the internal electrode and the green sheets for the zinc oxide varistor. Such chip varistor precursor was cut into pieces, followed by the sintering thereof for 2 hours at a temperature of 1250° C. Both terminals of the chip varistor were provided with Ag/Pd electrodes (Ag/Pd=90/10 mol %) by the heating treatment under a temperature condition of 900° C.

Figure 25:
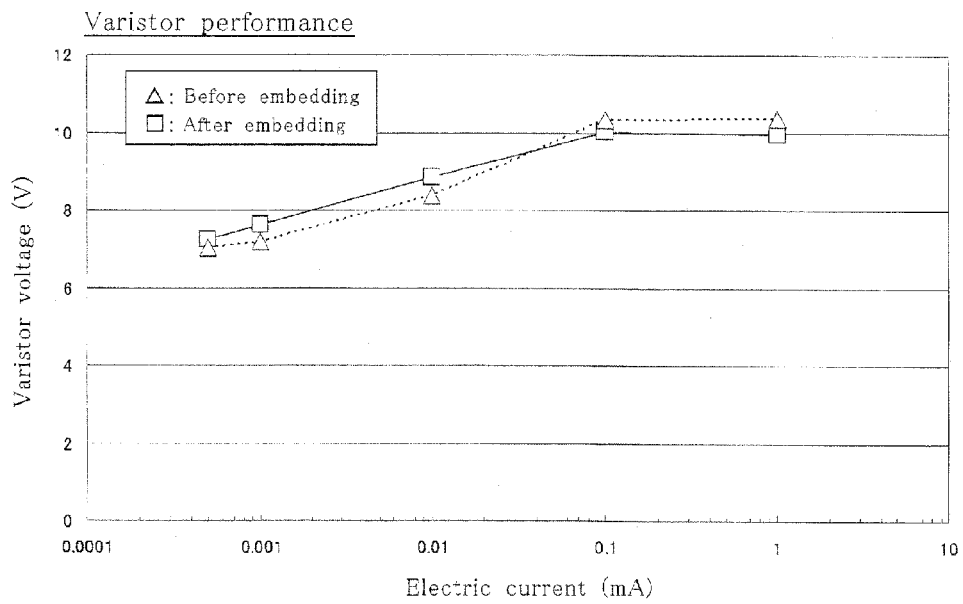
FIG. 25 is a graph showing a result of confirmation test of a varistor performance.

The result of the varistor performance before the embedding thereof is shown in the graph of FIG. 25. The graph of FIG. 25 also shows the varistor performance after the embedding thereof. In the graph of FIG. 25, the result for the varistor performance before the embedding thereof is indicated by the symbol "Δ", whereas the result for the varistor performance after the embedding thereof (wherein the sintering at the temperature of 900° C. was performed upon the embedding) is indicated by the symbol "□". As seen from the graph of FIG. 25, the result for the varistor performance before the embedding shows that the varistor voltage is about 10 V at an electrical current of 1 μA, and similarly the result for the varistor performance after the embedding also shows that the varistor voltage is about 10 V. In view of these results, it has been found that the varistor performance shows little change between before and after the embedding of the chip varistor in the substrate. While not wishing to be bound by any theory, this is due to the fact that the diffusion of the unnecessary material, which can cause the change of the performance, was suppressed because of the varistor which had been beforehand produced by the caclining at a high temperature of 1250° C. was subjected to the sintering at a low temperature of 900° C. It was therefore concluded that the present invention in which the sintered varistor is embedded in the substrate can provide a remarkably satisfactory built-in varistor in the substrate.
<Confirmation Test of Heat-Releasing of Substrate>

Another confirmation test was carried out to confirm the heat-releasing performance of the ceramic substrate with the built-in voltage-dependent resistive layer according to the present invention.

Specifically, tests were carried out based on the following two cases, i.e., Cases "A" and "B".

Case "A": Heat resistance of the substrate having the configuration of FIG. 9 was evaluated (i.e., the heat resistance of the structure in which the second electrode is accommodated in the voltage-dependent resistive layer was evaluated).

Case "B": Heat resistance of the substrate having the configuration of FIG. 10 was evaluated (i.e., the heat resistance of the heterogeneous substrate with its upper layer/lower layer being the ceramic substrate layer/aluminum nitride substrate layer as well as heterogeneous substrate with its upper layer/lower layer being the ceramic substrate layer/alumina substrate layer was evaluated).

(Case A)

The stacked body composed of the green sheets made of a glass ceramic and the sintered body of the voltage-dependant resistive layer was prepared. Thereafter, the stacked body was subjected to the sintering treatment at 900° C. for one hour (under the atmosphere of air). The part of the glass ceramic-green sheets had a thickness "T" of 400 μm, and the part of the accommodated voltage-dependant resistive layer had dimensions "w" of 0.5 mm square, and the accommodated electrode (i.e., second electrode) had dimensions "w2" of 350 μm square. A distance "t" between the top surface of the accommodated second electrode (serving as a reference varistor voltage) and a surface of the glass ceramic substrate was 20 μm (see FIG. 1 as to "T", "w", "w2" and "t").

Figure 21:
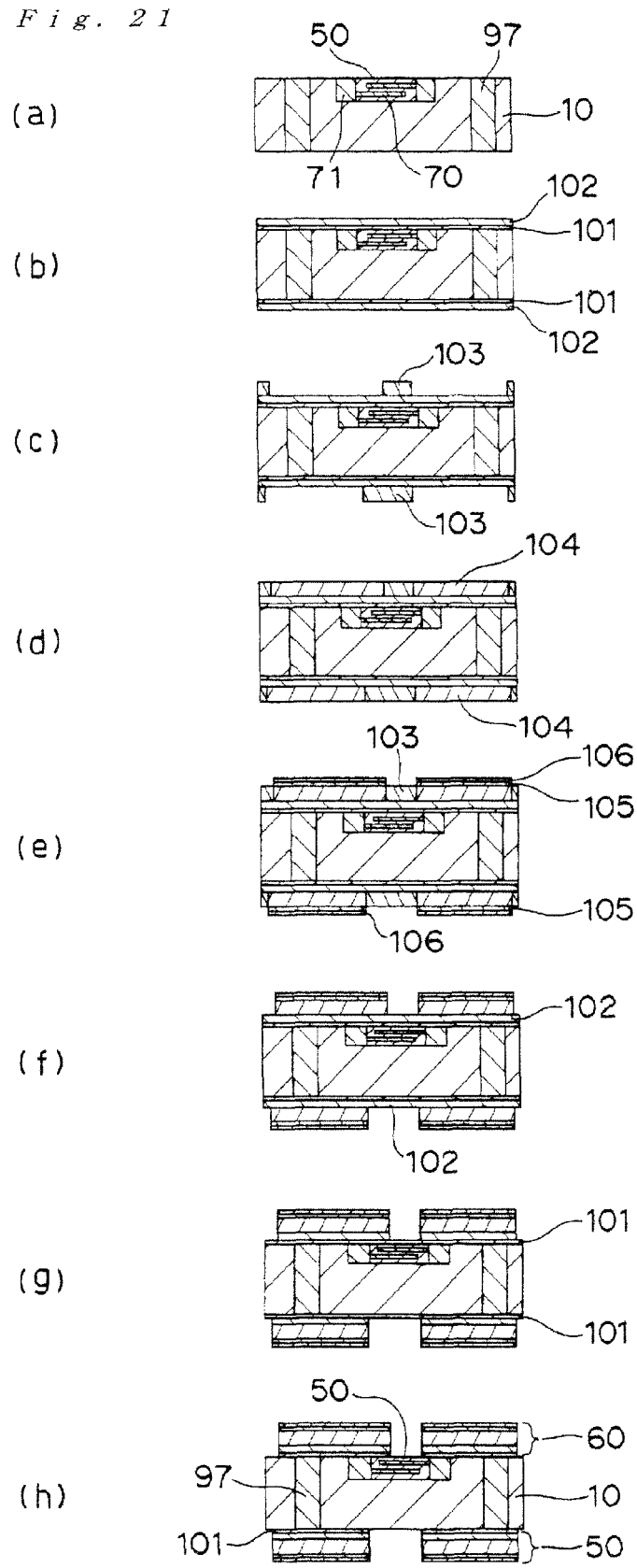
FIG. 21 includes cross sectional views schematically illustrating a process which can be replaced with the process of FIG. 19.

The process as illustrated in FIG. 21 was carried out with respect to the surface of the glass ceramic substrate wherein the stacked and sintered voltage-dependant resistive layer was provided. By such process, the copper electrode pattern as illustrated in FIG. 26 was formed. The copper electrode thus formed had a thickness "t1" of 70 μm. Then, the surface of the copper electrode was subjected to the Ni plating treatment and the Au plating treatment to form the Ni plating layer having a thickness of 5 μm and the Au plating layer having a thickness of 0.5 μm. The heat conductivity of the glass ceramic was 3.5 W/mK and the heat conductivity of the voltage-dependant resistive layer was 25 W/mK.

The mounting of the LED chip with respect to the "glass ceramic substrate thus manufactured wherein the voltage-dependant resistive layer had been provided" was performed in a manner of flip-chip mounting. The LED chip having a size of 0.5 mm square was used. In the LED chip, a plurality of Au bumps with their height of 30 μm were formed (cross sectional area of the Au bumps being 40% of the chip size). The LED was specifically mounted with respect to the first electrode having a thickness of 70 μm (Ni—Au plating film was further formed on the Cu electrode) by an ultrasonic wave process. Upon the mounting, a sealing resin was supplied between the LED chip and the first electrode, followed by a heat-curing treatment thereof. After the mounting, a phosphor material was applied to the LED chip to form a phosphor layer. Thereafter, a lens portion is integrally formed. The package precursor thus manufactured was cut into pieces so that the respective ones of the pieces had a size of 2.0 mm square. As a result, there can be obtained the LED package wherein a wiring pattern occupied about 80% of the substrate area. In this LED package, the heat generated by the LED chip can readily transfer in a lateral direction due to the existence of the copper electrode wherein the transferred heat is laterally distributed to be released from the substrate.

The heat resistance value of the substrate in the obtained LED package was measured. The measuring of the heat resistance value was performed by making use of, instead of the LED, a Si diode chip having the same shape as that of the LED (the reason for this is that all the electric power consumed in the LED is not converted into heat, but is partially converted into light). Specifically, a voltage of the diode was measured under the condition of the constant low current flowing through the diode. The temperature of an undersurface of the substrate was measured to sinter a junction temperature of the diode based on a temperature dependency of the diode voltage. Finally, the heat resistance was sintered based on a difference between the junction temperature and the undersurface temperature of the substrate.

As a result, it has been found that the heat resistance was $R_{th}$=14.02° C./W and therefore the LED package had an excellent heat-releasing performance.
(Case B)

The heat resistance of the heterogeneous substrate was evaluated in the case "B" in a similar manner as that of case "A". Specifically, the heat resistance was evaluated with respect to the case of the heterogeneous substrate of the LED package being composed of the upper layer/lower layers of ceramic substrate layer/aluminum nitride substrate layer, and being composed of the upper layer/lower layers of the ceramic substrate layer/alumina substrate layer.

More specifically, the heat resistance was evaluated with respect to not only the package substrate in which the lower layer was a 96% alumina substrate layer having a heat conductivity of 18 W/mK, but also the package substrate in which the lower layer was an alumina nitride substrate layer (AlN) having a heat conductivity of 170 W/mK. The thickness of the whole substrate was 400 μm, which was the same as that of the case "A". The substrate with its thickness of 400 μm was composed of the glass ceramic layer (in which a voltage dependant resistive layer was accommodated) with its thickness of 100 μm and the 96% alumina-substrate layer or aluminum nitride-substrate layer with its thickness of 300 μm. The method for manufacturing thereof is as follows. Firstly, the sintered alumina plate and aluminum nitride plate were prepared, respectively. Then, the glass ceramic-green sheets having a thickness of about 200 μm were provided and the sintered voltage dependant resistive layer was accommodated in the surface layer of the green sheets, followed by the sintering of the green sheets at a temperature of 900° C. The other treatments and conditions were similar to those of the case "A". As a result, there can be obtained the LED package.

The heat resistance value of the substrate of the obtained LED package was measured in a similar manner as that of the case "A". As a result, the heat resistance value $R_{th}$ was 10.36° C./W in the heterogeneous substrate of 96% aluminum sub-layer and the glass ceramic sub-substrate, and also the heat resistance value $R_{th}$ was 6.38° C./W in the heterogeneous substrate of the aluminum nitride (AlN) sub-layer and the glass ceramic sub-substrate. It has been thus found that the heat resistance value in the case of the heterogeneous substrate was improved by 30% to 55% in comparison with that of the case "A". This means that, on the assumption that the same amount of electric power is supplied, the heat generation can be suppressed by 30% to 55%. Therefore, it has been found that the LED package using the heterogeneous substrate was excellent in the heat-releasing performance. In the case of the heterogeneous substrate of case "B", the aluminum or the aluminum nitride having greater strength than that of the glass ceramic was used for the substrate, the obtained substrate package had an improved bending strength as well as the improved heat-releasing performance.

INDUSTRIAL APPLICABILITY

The LED equipped the substrate for light-emitting element according to the present invention can be suitably available for various lighting uses since it has an improved brightness and a compacted size. Such LED according to the present invention can also be suitably available for wide range of applications, for example, a backlight source application (for LCD images), camera flash application, vehicle installation application.

CROSS REFERENCE TO RELATED PATENT APPLICATION

The present application claims the right of priority of Japan patent application No. 2010-43773 (filing date: Mar. 1, 2010, title of the invention: SUBSTRATE FOR LIGHT-EMITTING ELEMENT, METHOD FOR MANUFACTURING THE SAME AND LIGHT-EMITTING DEVICE), the whole contents of which are incorporated herein by reference.

EXPLANATION OF REFERENCE NUMERALS

10 Body of substrate
10A Upper layer of substrate body

10B Lower layer of substrate body
10' Green sheet
20 Light-emitting element (e.g., LED chip)
30 Sealing resin
25 Mounting area for light-emitting element
42 Convex-shaped die
47 Carrier film
50 Voltage-dependent resistive layer
50' Green sheet for voltage-dependent resistive layer
60 First electrode
60a, 60b sub-electrode of first electrode
70 Second electrode
70' Second electrode precursor layer
70a, 70b Sub-electrode of second electrode
$70A_1$, $70A_2$ Second electrode accommodated in interior of voltage-dependent resistive layer
$71A_1$, $71A_2$ External electrode
80 Phosphor layer (Fluorescent layer)
90 Metal layer (Patterned wiring layer)
94 Thermal via or thermal via hole
97 Through-hole
98 Bump
100 Substrate for light-emitting element (Present invention)
101 Ti thin film
102 Cu thin film
105 Ni plating layer
106 Au plating layer
110 Protection element
150 LED package
200 LED package of prior art (Prior art)
210 Substrate of package
220 LED element
270 Zener diode element

The invention claimed is:

1. A substrate including a mounting surface on which a light-emitting element is to be mounted, the mounting surface being one of two opposed main surfaces of the substrate, and the other of the two opposed main surfaces being opposite the mounting surface:
   wherein the substrate is provided with a protection element for the light-emitting element, the protection element comprising a voltage-dependent resistive layer embedded in the substrate, and comprising a first electrode and a second electrode each of which is in connection with the embedded voltage-dependent resistive layer;
   wherein the embedded voltage-dependent resistive layer is a single layer;
   wherein the light-emitting element is to be mounted such that the light-emitting element is positioned in an overlapping relation with the embedded voltage-dependent resistive layer;
   wherein the protection element comprising the embedded voltage-dependent resistive layer is a varistor element;
   wherein the first electrode has a divided form wherein two divided pieces of the first electrode are positioned in contact with a substrate exposure surface of the embedded voltage-dependent resistive layer, whereas the second electrode is positioned such that it is in contact with a substrate embedment surface of the embedded voltage-dependent resistive layer in an opposed relation to the first electrode;
   wherein the substrate exposure surface of the embedded voltage-dependent resistive layer is exposed from the substrate such that the substrate exposure surface of the embedded voltage-dependent resistive layer is flush with the one or the other of the two opposed main surfaces of the substrate; and
   wherein the varistor element includes two serially-connected varistor elements which share the second electrode provided on the substrate embedment surface of the embedded voltage-dependent resistive layer.

2. The substrate according to claim 1, wherein the substrate exposure surface of the embedded voltage-dependent resistive layer forms a part of the mounting surface.

3. The substrate according to claim 1, wherein the substrate exposure surface of the embedded voltage-dependent resistive layer forms a part of the other of the two opposed main surfaces of the substrate.

4. The substrate according to claim 1,
   wherein the second electrode is in connection with an electrode or metal layer provided on the one or the other of the two opposed main surfaces via a via hole which extends within the substrate between the embedded voltage-dependent resistive layer and the one or the other of the two opposed main surfaces.

5. The substrate according to claim 1, wherein a positive electrode of the light-emitting element is to be in connection with one of the two divided pieces of the first electrode, whereas a negative electrode of the light-emitting element is to be in connection with the other of the two divided pieces of the first electrode.

6. The substrate according to claim 1, wherein the substrate has a two-layered structure composed of an upper layer and a lower layer made of different materials from each other, the upper layer defining the mounting surface and having the embedded voltage-dependent resistive layer embedded therein.

7. A light-emitting device comprising the substrate according to claim 1 and the light-emitting element mounted on the mounting surface of the substrate.

8. The light-emitting device according to claim 7, wherein the light-emitting element is an LED chip equipped with a positive electrode and a negative electrode on its surface which is opposed to a light-emitting surface of the LED chip; and
   wherein the LED chip is flip-chip mounted on the mounting surface of the substrate.

* * * * *